US008658452B2

(12) United States Patent
El-Gamal et al.

(10) Patent No.: US 8,658,452 B2
(45) Date of Patent: Feb. 25, 2014

(54) LOW TEMPERATURE CERAMIC MICROELECTROMECHANICAL STRUCTURES

(75) Inventors: Mourad El-Gamal, Brossard (CA); Frederic Nabki, Montreal (CA); Paul-Vahe Cicek, Montreal (CA)

(73) Assignee: The Royal Institution for the Advancement of Learning / McGill University, Montreal (CA)

( * ) Notice: Subject to any disclaimer, the term of this patent is extended or adjusted under 35 U.S.C. 154(b) by 0 days.

(21) Appl. No.: 13/003,328

(22) PCT Filed: Jul. 8, 2009

(86) PCT No.: PCT/CA2009/000931
§ 371 (c)(1),
(2), (4) Date: Jan. 12, 2011

(87) PCT Pub. No.: WO2010/003228
PCT Pub. Date: Jan. 14, 2010

(65) Prior Publication Data
US 2011/0111545 A1 May 12, 2011

Related U.S. Application Data

(60) Provisional application No. 61/129,644, filed on Jul. 9, 2008.

(51) Int. Cl.
*H01L 21/00* (2006.01)
*H01L 27/14* (2006.01)

(52) U.S. Cl.
USPC .................... 438/48; 438/51; 257/414

(58) Field of Classification Search
USPC ............... 438/48–53; 257/414, 415, 417, 419
See application file for complete search history.

(56) References Cited

U.S. PATENT DOCUMENTS

| | | | | |
|---|---|---|---|---|
| 7,903,532 | B2 * | 3/2011 | Chu et al. | 369/126 |
| 2004/0063325 | A1 * | 4/2004 | Urano et al. | 438/692 |
| 2007/0228887 | A1 * | 10/2007 | Nishigaki et al. | 310/332 |
| 2007/0272864 | A1 * | 11/2007 | Li et al. | 250/338.4 |
| 2008/0164542 | A1 * | 7/2008 | Yang et al. | 257/415 |

* cited by examiner

*Primary Examiner* — Hsien Ming Lee
(74) *Attorney, Agent, or Firm* — The Law Office of Michael E. Kondoudis

(57) ABSTRACT

A method of providing microelectromechanical structures (MEMS) that are compatible with silicon CMOS electronics is provided. The method providing for processes and manufacturing sequences limiting the maximum exposure of an integrated circuit upon which the MEMS is manufactured to below 350° C., and potentially to below 250° C., thereby allowing direct manufacturing of the MEMS devices onto electronics, such as Si CMOS circuits. The method further providing for the provisioning of MEMS devices with multiple non-conductive structural layers such as silicon carbide separated with small lateral gaps. Such silicon carbide structures offering enhanced material properties, increased environmental and chemical resilience whilst also allowing novel designs to be implemented taking advantage of the non-conductive material of the structural layer. The use of silicon carbide being beneficial within the formation of MEMS elements such as motors, gears, rotors, translation drives, etc where increased hardness reduces wear of such elements during operation.

24 Claims, 23 Drawing Sheets

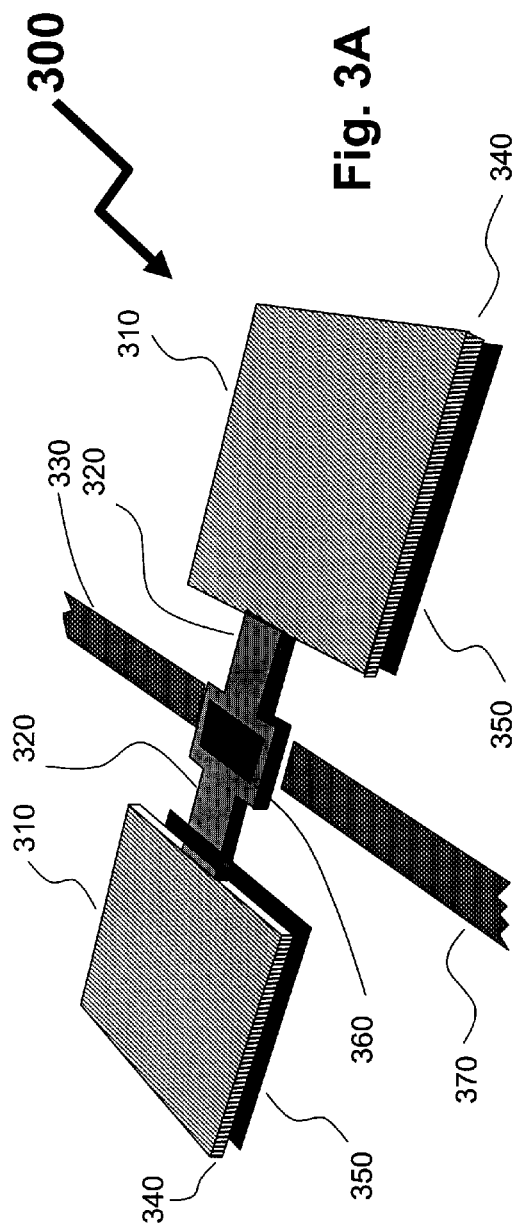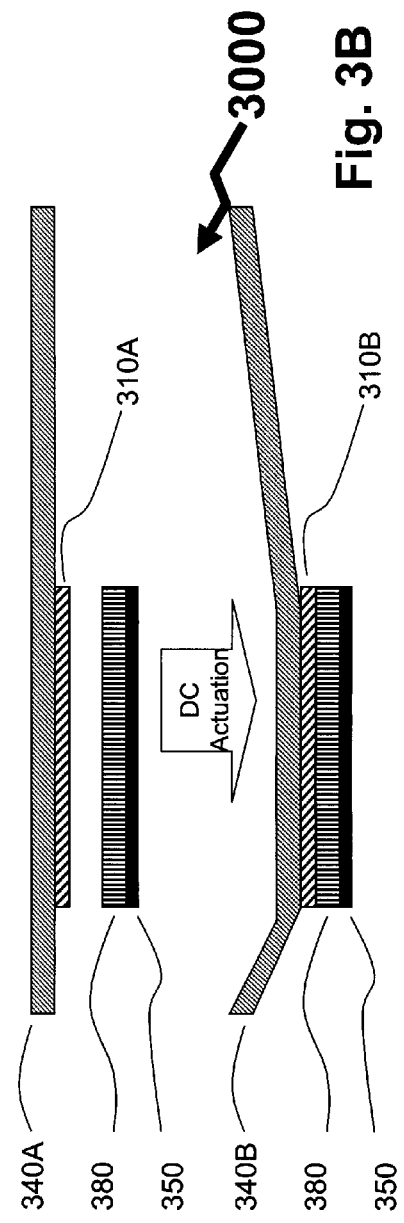

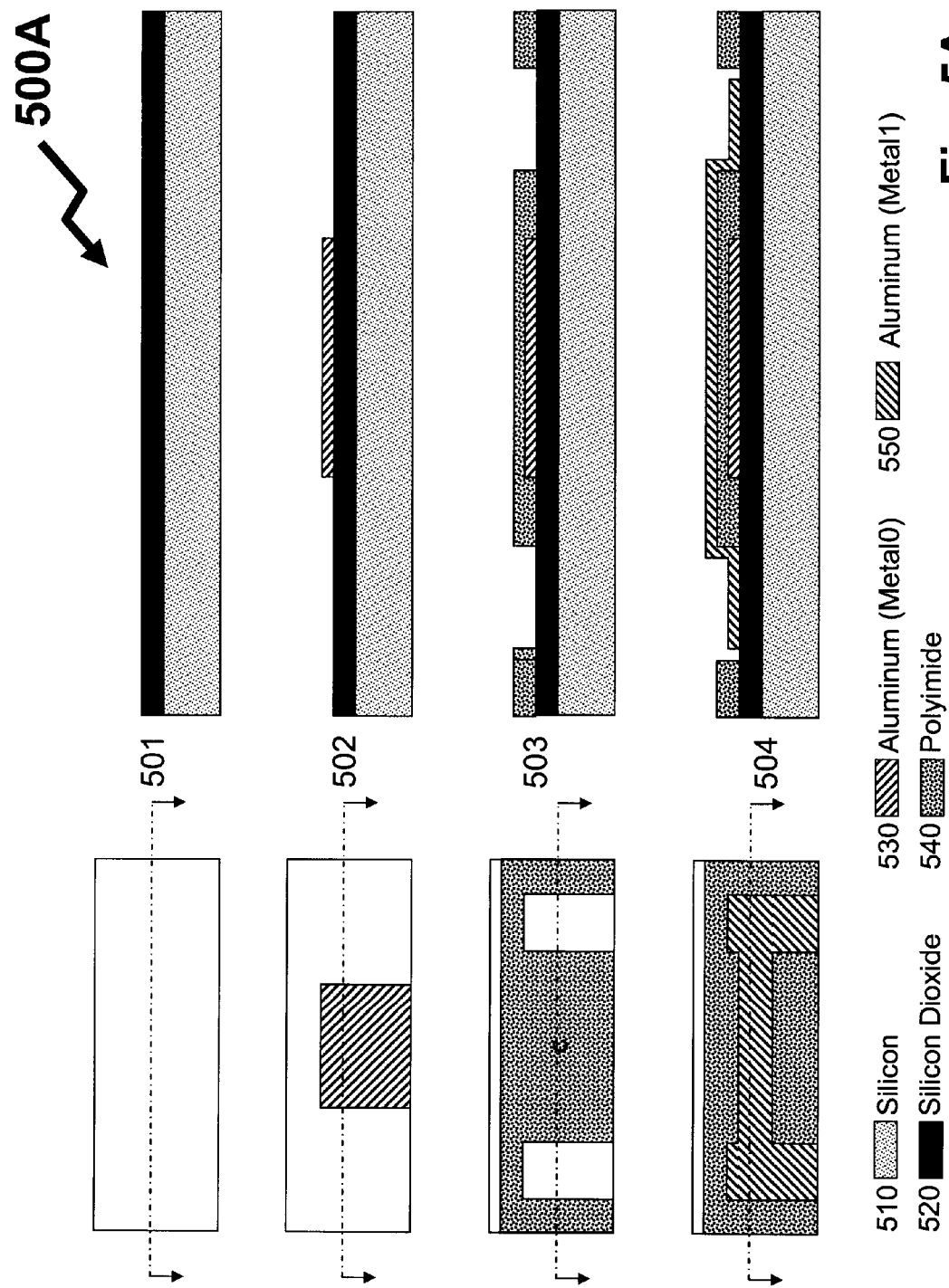

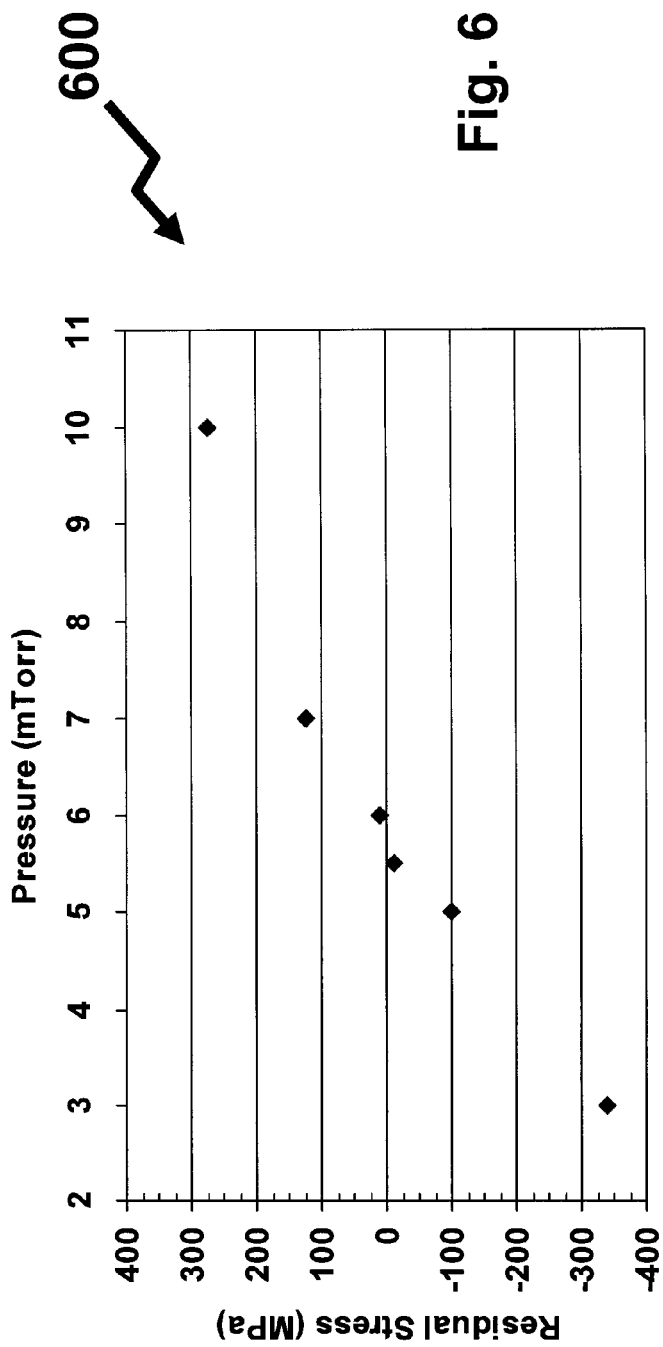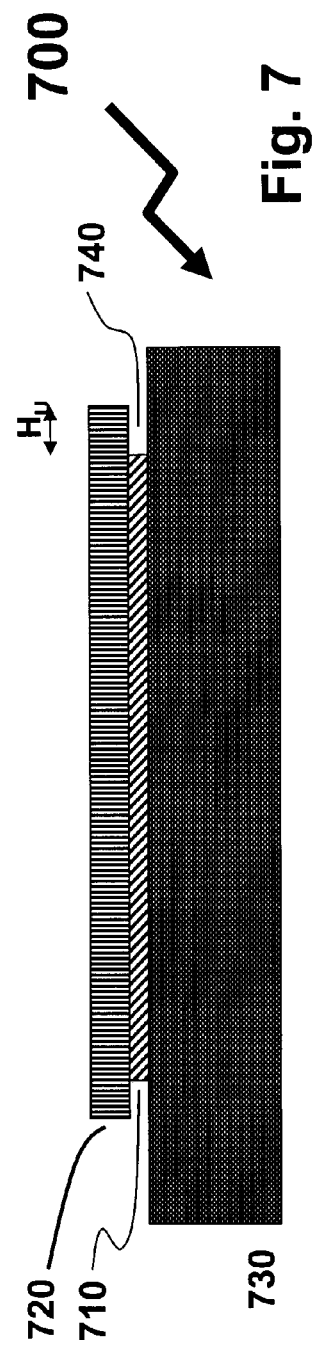

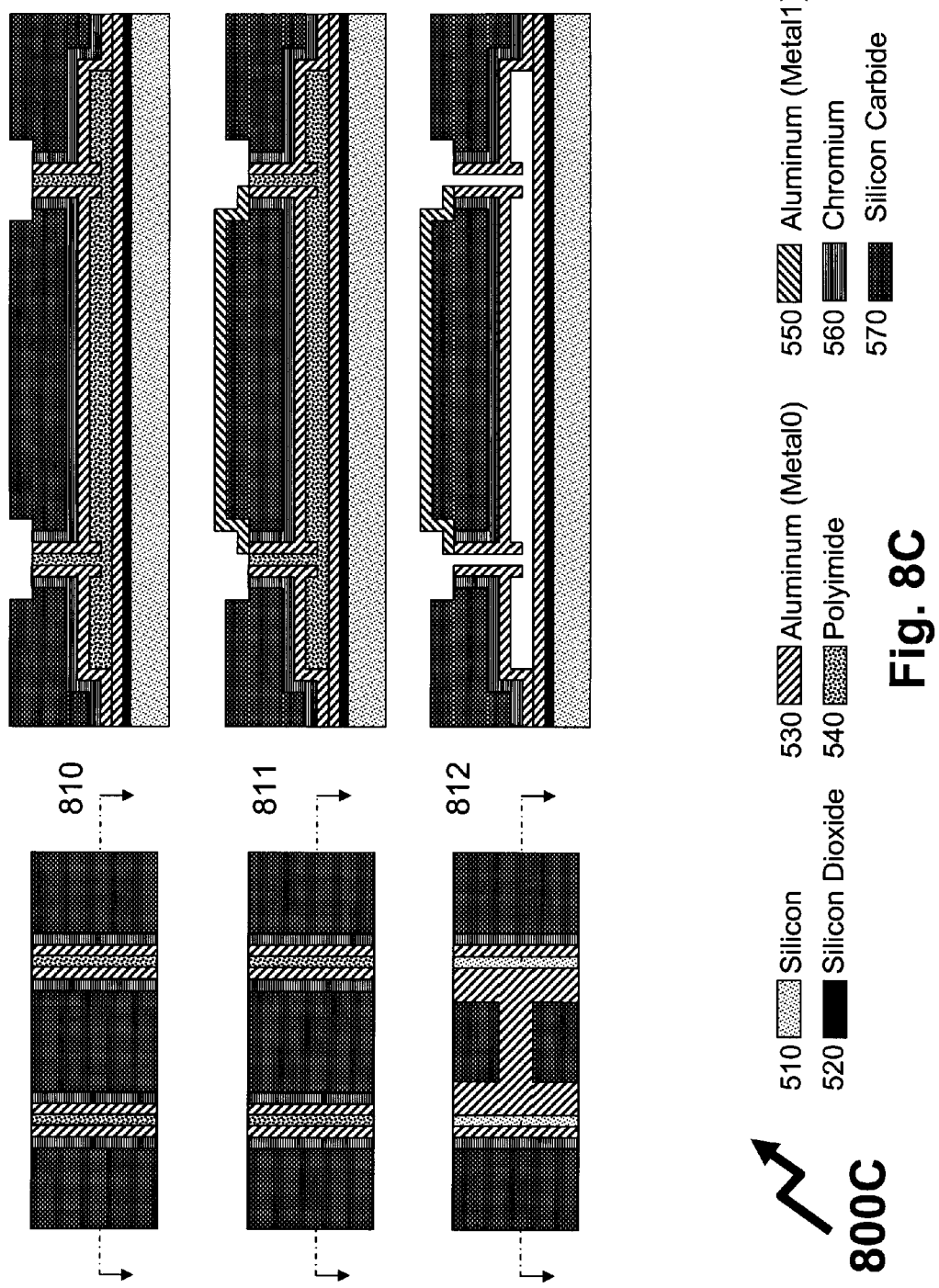

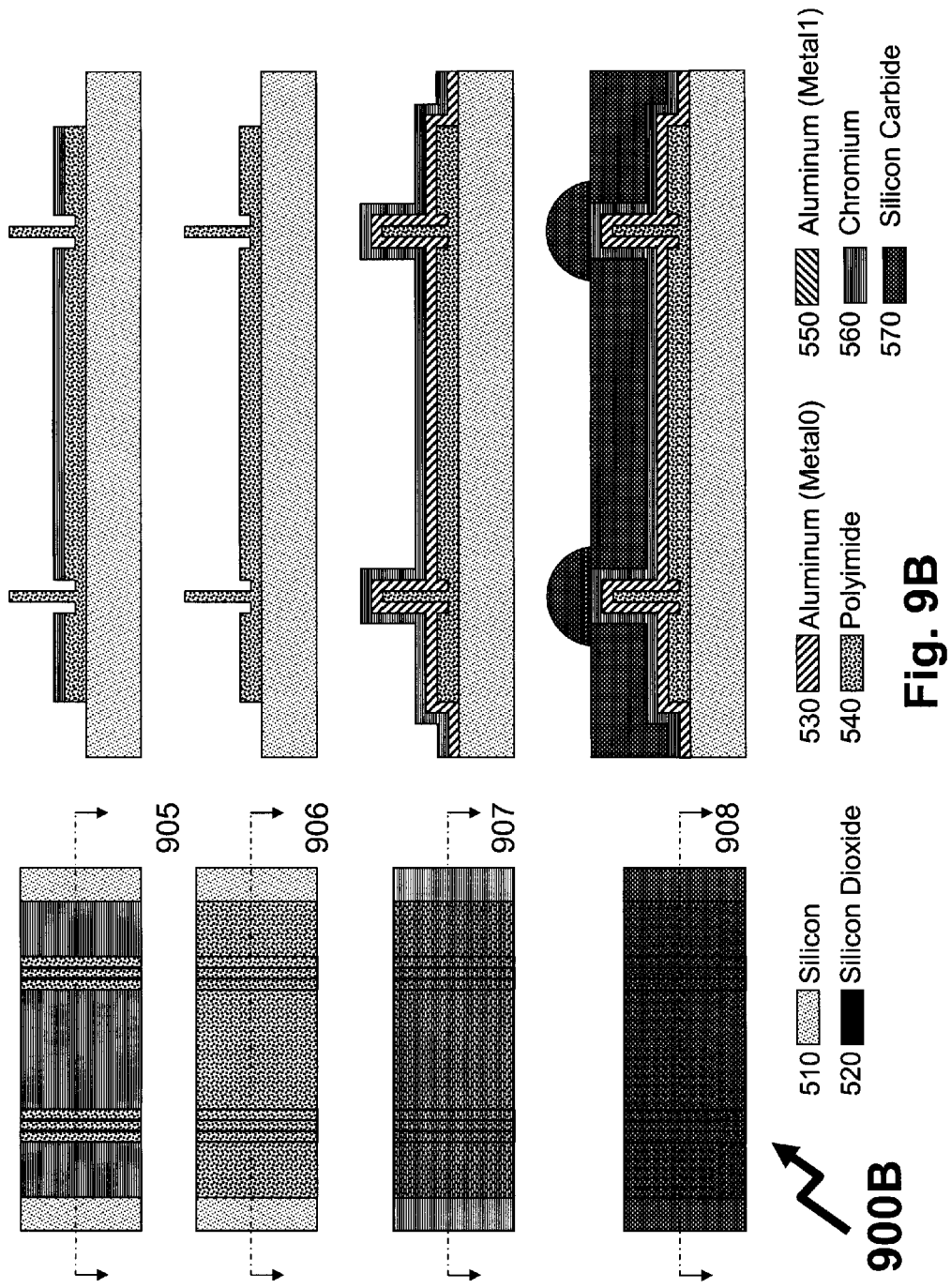

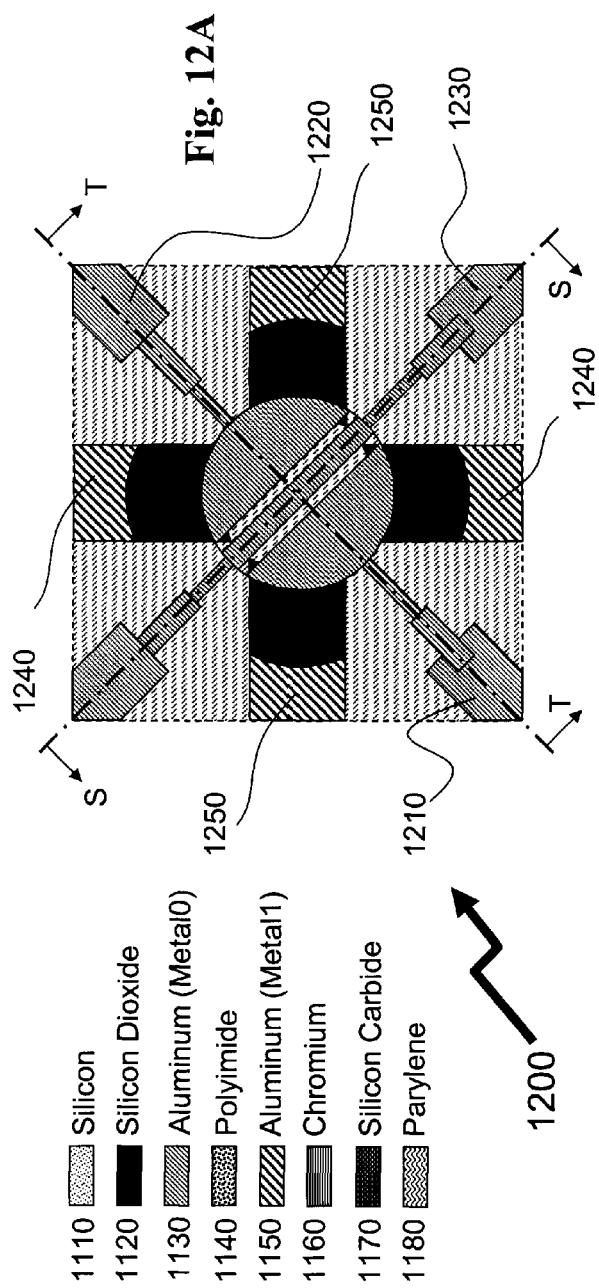
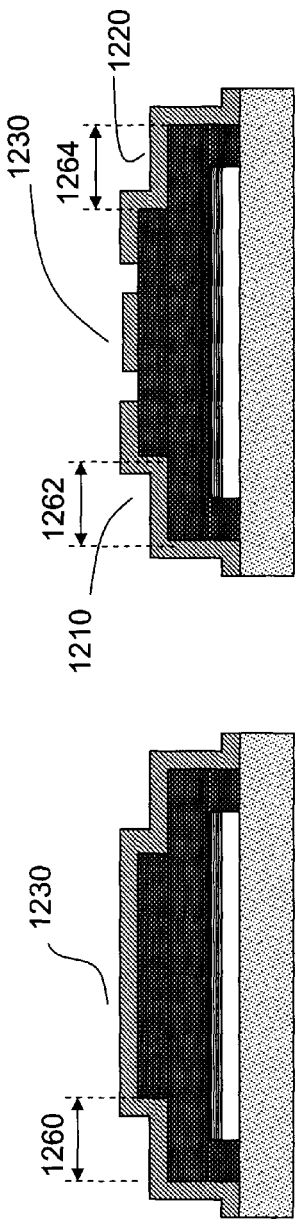
Fig. 12A
Fig. 12B Section S-S
Fig. 12C Section T-T
1110 Silicon
1120 Silicon Dioxide
1130 Aluminum (Metal0)
1140 Polyimide
1150 Aluminum (Metal1)
1160 Chromium
1170 Silicon Carbide
1180 Parylene

LOW TEMPERATURE CERAMIC MICROELECTROMECHANICAL STRUCTURES

CROSS-REFERENCE TO RELATED APPLICATIONS

This application claims the benefit of priority to U.S. Provisional Patent Application Ser. No. 61/129,644 filed Jul. 9, 2008 entitled "Low Temperature Ceramic MicroElectroMechanical Structures".

FIELD OF THE INVENTION

The invention relates to manufacturing MEMS devices and more particularly to manufacturing and designing MEMS devices with lateral features and metallization for integration directly with integrated electronic circuits.

BACKGROUND OF THE INVENTION

Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically MEMS devices have leveraged and extended the fabrication techniques developed for the silicon integrated circuit industry, namely lithography, doping, deposition, etching, etc to add mechanical elements such as beams, gears, diaphragms, and springs to silicon circuits either as discrete devices or in combination with integrated silicon electronics. Whilst the majority of development work has focused on silicon (Si) electronics additional benefits may be derived from integrating MEMS devices onto other existing electronics platforms such as silicon germanium (SiGe), gallium arsenide (GaAs) and, indium phosphide (InP) for RF circuits and future potential electronics platforms such as organic based electronics, nanocrystals, etc.

Examples of MEMS device application today include ink-jet-printer cartridges, accelerometers, miniature robots, micro-engines, locks, inertial sensors, micro-drives, micro-mirrors, micro actuators, optical scanners, fluid pumps, transducers, chemical sensors, pressure sensors, and flow sensors. New applications are emerging as the existing technology is applied to the miniaturization and integration of conventional devices. These systems can sense, control, and activate mechanical processes on the micro scale, and function individually or in arrays to generate effects on the macro scale. The micro fabrication technology enables fabrication of large arrays of devices, which individually perform simple tasks, or in combination can accomplish complicated functions.

The MEMS market is currently projected to exceed US$10 Billion in 2011, doubling from its estimated 2005 revenues of $5 Billion, according to Semiconductor Partners (Phoenix) ("*Driving MEMS beyond Automotive*" September 2007). Whilst historically the automotive MEMS market has dominated and will still show robust growth as the number of MEMS devices per vehicle increases from an average of 40 per mid-range vehicle to ~60 MEMS for the same class of vehicle in 2011 it is the potential for growth in the consumer, communication and portable device markets that is more significant. Such applications include monolithic microphones and loudspeakers, oscillators, handheld controls for gaming devices and cellular telephones, hard disk drives, RF switches and ink jet print heads. The MEMS mobile cellular telephone market alone is expected to exceed US$0.5 Billion in 2008 according to Research and Markets ("*Mems4Mobile 06: Updated Analysis of the Applications and Markets of MEMS in Mobile Communications*" February 2006). Such MEMS devices incorporated into cellular telephones potentially including silicon microphones, 3D accelerometers, gyroscopes for camera stabilization and GPS navigation, microfuel cells, personal weather stations, and biochips for health care monitoring.

MEMS have become a successful sensing and actuating technology. Because of their extensive optical, electrical to mechanical functionalities, MEMS devices are suited to applications in many different fields of science and engineering. However, because of this vast range of functionality, MEMS fabrication processes, unlike the microelectronics industry, are difficult to gear towards general applications. As a result most processes are aimed at the fabrication of a few devices, and usually performance of the devices is hindered by process variability. As MEMS devices are typically sensing weak analog signals, for example pressure, acceleration, vibration, magnetic or electric fields, with capacitive based elements, there is considerable benefit in being able to integrate analog front-end electronics to buffer, amplify and process these weak electronic signals and either facilitate their direct processing, such as with RF signals, or their digitization for sensing and measurements applications.

Historically CMOS electronics has become the predominant technology in analog and digital integrated circuits. This is essentially because of the unparalleled benefits available from CMOS in the areas of circuit size, operating speed, energy efficiency and manufacturing costs which continue to improve from the geometric downsizing that comes with every new generation of semiconductor manufacturing processes. In respect of MEMS systems, CMOS is particularly suited as CMOS circuits dissipate power predominantly during operation and have very low static power consumption. This power consumption arising from the charging and discharging of various load capacitances within the CMOS circuits, mostly gate and wire capacitance, but also transistor drain and transistor source capacitances, whenever they are switched. The charge moved is the capacitance multiplied by the voltage change. Multiply by the switching frequency to get the current used, and multiply by voltage again to get the characteristic switching power, P, dissipated by a CMOS device, and hence $$P=CV^2 f \qquad (1).$$

Historically, CMOS designs operated at supply voltages ($V_{dd}$) much larger than their threshold voltages ($V_{th}$), for example $V_{dd}$=5V and $V_{th}$=700 mV for both NMOS and PMOS. However, today CMOS manufacturers have adjusted designs and materials such that today an NMOS transistor may have a $V_{th}$ of 200 mV and allow operation from voltages as low as $V_d$=1V offering a significant power reduction which is important in sensing, mobile, chemical and biomedical applications.

However, combining CMOS and MEMS technologies has been especially challenging because some MEMS process steps—such as the use of special materials, the need for high temperature processing steps, the danger of contamination due to the MEMS wet etching processes etc.—are incompatible with the requirements of CMOS technology. Thus, strong attention has to be paid to avoid cross contaminations between both process families. Accordingly today MEMS processes exist that are discrete and standalone, such as Robert Bosch's (U.S. Pat. No. 5,937,275 "Method of Producing Acceleration Sensors", MEMSCAP's "Multi-User MEMS Processes" (MUMPs®) including PolyMUMPs™, a three-layer polysilicon surface micromachining process: MetalMUMPs™, an electroplated nickel process; and SOI-MUMPs™, a silicon-on-insulator micromachining process), and Sandia's Ultra-planar Multi-level MEMS Technology 5 (SUMMiT V™ Fabrication Process which is a five-layer polycrystalline silicon surface micromachining process with one ground plane/electrical interconnect layer and four mechanical layers).

Other processes have been developed to allow MEMS to be fabricated before the CMOS electronics, such as Analog Devices' MOD-MEMS (monolithically integrate thick (5-10 um) multilayer polysilicon MEMS structures with sub-micron CMOS), and Sandia's iMEMS. Finally, processes have been developed to provide MEMS after CMOS fabrication such as Sandia's micromechanics-last MEMS, Berkeley Sensor & Actuator Center (BSAC), and IMEC silicon-germanium processes. Additionally DALSA Semiconductor have a highly publicized "low temperature" micro-machining with silicon dioxide process, see L. Ouellet et al (U.S. Pat. No. 7,160,752 "Fabrication of Advanced Silicon-Based MEMS Devices", Issued Jan. 9, 2007) wherein low stress structures were fabricated at temperatures between 520° C. and 570° C., being just below the temperature of eutectic formation in aluminum-silicon-copper interconnections.

However, the mechanical properties of silicon do not make it the most suitable structural material for MEMS. Recently, silicon carbide (SiC) has generated much interest as a MEMS structural material because of its distinctive properties. SiC boasts better suited mechanical properties such as higher acoustic velocity, high fracture strength and desirable tribological properties. Its ability to sustain higher temperatures, and resist corrosive and erosive materials makes SiC, unlike silicon, a potential candidate material for use in harsh environments. SiC is also being investigated and shows promise as a biocompatible material, see for example *"Porous Silicon Carbide as a Membrane for Implantable Biosensors"* (A. J. Rosenbloom et al, Biomedical Microdevices, Vol. 6, No. 4, December 2004, Springer), *"Biocompatibility of Silicon Carbide in Colony Formation Test in Vitro"* (S. Santavirta et al, Archives of Orthopedic and Trauma Surgery, Vol. 118, Nos. 1-2, November 1998), and "SiC Based Artificial Dental Implant" (U.S. Pat. No. 5,062,798, K. Tsuge et al). These factors, along with the maturation of deposition and patterning techniques, make SiC a potential choice for high-performance MEMS processing.

However, difficulties with SiC processing have made its use non-trivial as it is non-conductive and difficult to deposit and dope at CMOS compatible temperatures. Stress control is also difficult because of the high intrinsic stresses that can develop in such a material. Because if its intrinsic inertness, selective etching of SiC is difficult. As most materials are etched at a faster rate than SiC, issues arise when masking SiC for patterning and ensuring a reliable etch-stop. Whether it is for doping or for deposition, SiC needs to generally be processed at high temperatures. As such prior art SiC MEMS processes have not lent themselves well to CMOS integration. Further as most MEMS applications require electrical signal processing, integration of MEMS to transistor-able processes, such as CMOS, is paramount.

Recently a low temperature SiC processing technique was outlined by F. Nabki et al ("A Low-Temperature (<300° C.) Silicon Carbide Surface Micromachining Fabrication Technology for Micromechanical Resonators", Hilton Head Workshop 2008: Solid-State Sensors, Actuators and Microsystems Workshop, Paper P23) allowing direct SiC MEMS devices to be fabricated directly atop silicon CMOS electronics. The process outlined providing SiC structures with metallization formed on the upper surface of the SiC, the lower surface of the SiC, and optionally both surfaces. Typical structures with the work of Nabki et al including capacitors, switches, and resonators wherein the structures were anchored at each end with vertical electrostatic actuation. However, in other MEMS devices there are instances of free standing structures wherein only one or no end of the beam is anchored to the silicon, and actuation is laterally performed. Examples of such structures include gears, comb drives, accelerometers, gyros, and hinges. Such structures being referred to as having lateral structure rather than being simple vertically actuated beams.

Therefore, it would be beneficial to have MEMS processes that allow for manufacturability and integration of SiC with silicon CMOS electronics, to effectively harness the benefits of SiC, and for these MEMS processes to allow lateral structures to be implemented in a process compatible with the other MEMS structures and directly atop silicon CMOS electronics. Furthermore, this process must allow for efficient electrostatic actuation through actuation nano-scale gap control, and gaps which are metalized on their periphery. Accordingly, the invention provides for a SiC-based MEMS process enabling lateral structures and metalized gaps with the benefits of stress control, conformal coatings, metal interconnects, and low-temperature film deposition. The invention providing further a route to very low-cost and high manufacturability process implementations compatible with CMOS integration.

SUMMARY OF THE INVENTION

In accordance with the invention there is provided a method comprising a substrate, and providing at least a low temperature deposited MEMS structure comprising at least two MEMS elements, the two MEMS elements having a lateral gap between them along first predetermined portions of the two MEMS elements and metallization upon second predetermined portions of the first predetermined portions of the two MEMS structures.

In accordance with another embodiment of the invention there is provided a method comprising manufacturing a low temperature MEMS structure comprising at least two MEMS elements onto a substrate and having a lateral gap between them along predetermined portions of the two MEMS elements, the manufacturing comprising at least one predetermined process of a plurality of predetermined processes, each predetermined process limiting the maximum temperature of the substrate to below at least one of 350° C. and 250° C., the one predetermined process of the plurality of predetermined processes for removing a predetermined material to provide the lateral gap.

In accordance with another embodiment of the invention there is provided a method comprising designing a low temperature MEMS device comprising at least two MEMS elements onto a substrate having a lateral gap between them along predetermined portions of the two MEMS elements and metallization upon second predetermined portions of the first predetermined portions of the two MEMS structures, the low temperature MEMS device based upon a semiconductor based manufacturing process comprising at least one semiconductor process of a plurality of semiconductor processes, each of the plurality of semiconductor processes limiting the maximum temperature of at least one of the in-process low temperature MEMS device and a substrate onto which the low temperature MEMS device is being manufactured to below at least one of 350° C. and 250° C., the one semiconductor process of semiconductor processes for removing a predetermined material to provide the lateral gap.

In accordance with another embodiment of the invention there is provided a method comprising providing a substrate, providing at least one lower metallization of a plurality of lower metallizations, providing at least one of a first sacrificial layer and a second sacrificial layer, and providing at least one middle metallization of a plurality of middle metallizations. The method further comprising providing a structural layer, providing at least one upper metallization of a plurality of upper metallizations, and removing at least one of the first sacrificial layer and the second sacrificial layer.

BRIEF DESCRIPTION OF THE DRAWINGS

Exemplary embodiments of the invention will now be described in conjunction with the following drawings, in which:

FIGS. 3A and 3B illustrates an application of the invention to form a MEMS RF switch;

FIGS. 5A and 5B illustrate a process flow for providing a MEMS SiC on Si CMOS according to F. Nabki et al;

FIG. 6 illustrates the controlled stress deposition of thick SiC MEMS structural layers;

FIG. 7 illustrates a novel bimetallic mask for the etching of SiC;

FIGS. 8A through 8C illustrate an embodiment of the invention to providing lateral features within a SiC ceramic MEMS;

FIGS. 12A through 12C depict an alternative embodiment of the invention as applied to a resonator wherein the electrical structure on the resonator provides both a heater structure in addition to the DC and AC signals.

DETAILED DESCRIPTION OF EMBODIMENTS OF THE INVENTION

Figure 1:
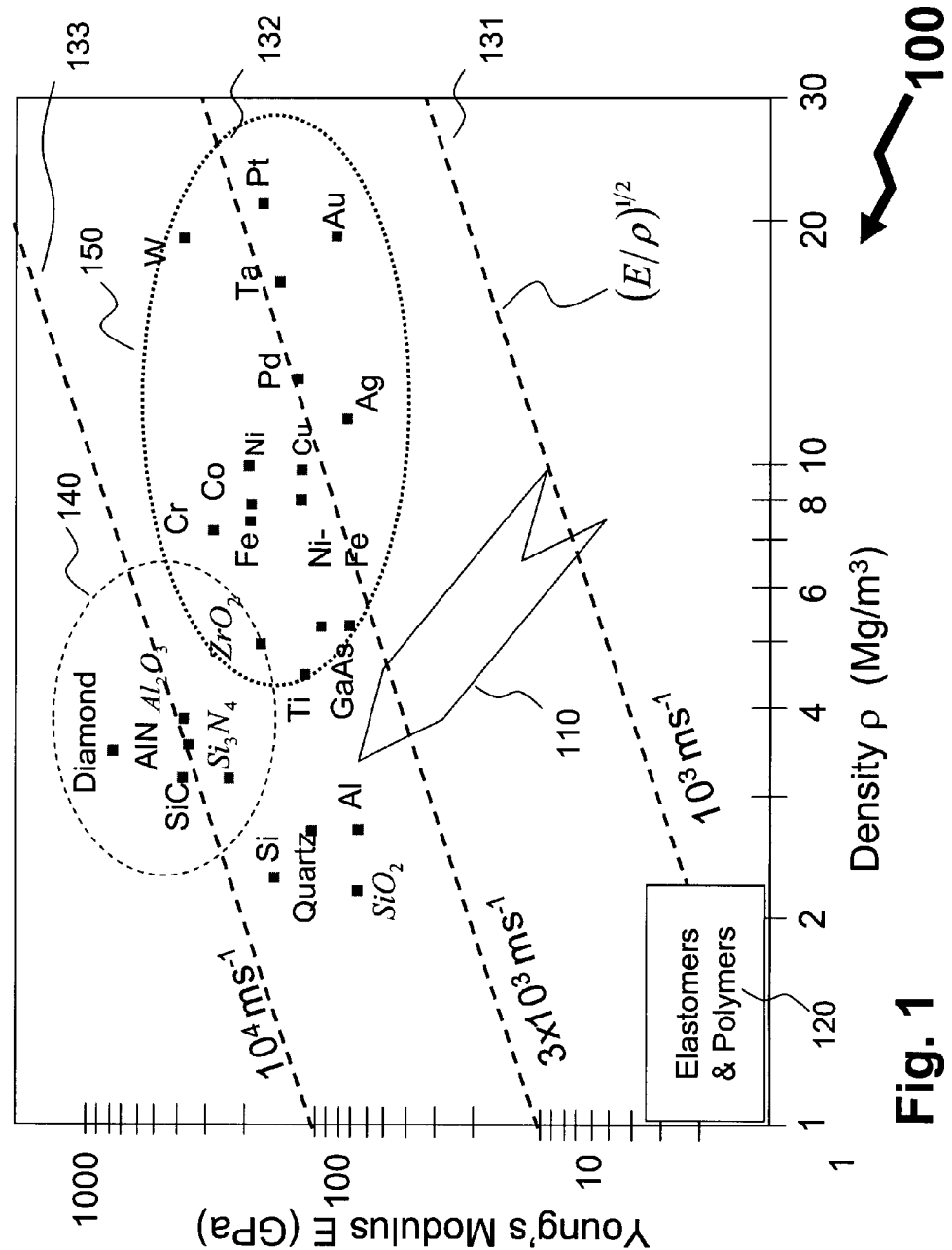
FIG. 1 illustrates the benefits of SiC for MEMS device implementations over Si.

Referring to FIG. 1 shown is a material selection chart 100 for MEMS device implementations. Plotted onto the material selection chart are a range of different materials including metals, dielectrics, ceramics and polymers. Each material being represented by a point on the X-Y graph wherein the X-axis is density and Young's modulus is the Y-axis. The data being plotted is according to the work of V. T. Srikar et al "Materials Selection in Micro-Mechanical Design: An Application of the Ashby Approach" (J. Microelectromechanical Systems Vol. 10, No. 1, pp. 3-10). As acoustic velocity, a factor governing the resonant frequency of structural materials, is determined in accordance to Equation 2 below shown are lines of constant acoustic velocity 131, 132, 133 of $1\times10^3$ ms$^{-1}$, $3\times10^3$ ms$^{-1}$, and $1\times10^4$ ms$^{-1}$ respectively.

$$v = \sqrt{\frac{E}{\rho}}.$$ (2)

As evident from the material selection chart, different types of materials tend to be grouped together. Ceramic materials 140 tending to appear in the top left, metals 150 appearing in the middle-right, whilst polymers and elastomers 120 are grouped together in the bottom-left. The trend arrow 110 indicating the direction of preference for selecting materials for MEMS application in having high Young's modulus and low density. Accordingly, from material selection chart 100 better alternatives to silicon (Si) would be silicon carbide (SiC), alumina (Al2O3) or diamond (C). Of these three, SiC represents an interesting choice as processing technology it requires is relatively mature. Although great strides are being made in developing nano-crystalline diamond for microsystem design, see for example J. Wang et al "1.51 GHz nano-Crystalline Diamond Micromechanical Disk Resonator with Material Mismatched Isolating Support" (IEEE 17$^{th}$ Annual Conf. on Micro Electro Mechanical Systems, 2004, pp. 641-644), the technology is still not widely available. Additionally SiC offers an increased hardness when compared with silicon, a hardness of 9 mohs versus 6.5 mohs where diamond has a hardness of 10 mohs. The increased hardness providing increased lifetime for MEMS elements such as gears, motors, translation drives, etc. Also, SiC's high elastic modulus allows for higher resonant frequencies, hence enabling higher frequency operation of devices such as micro-mirrors or accelerometers, and yielding better actuation and sensing performance.

Figure 2:
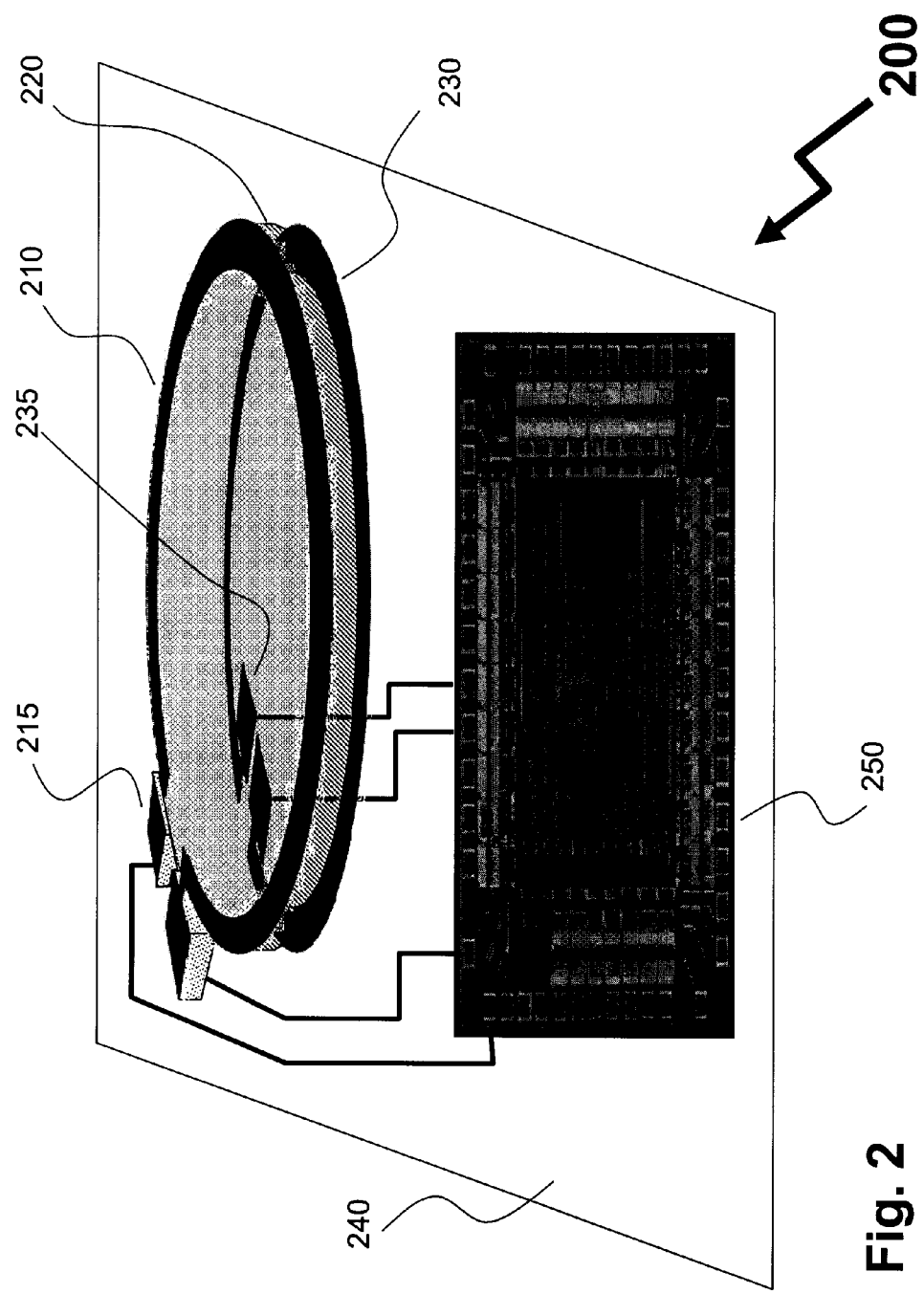
FIG. 2 illustrates an application of the invention in a MEMS inductor.

FIG. 2 illustrates an application of the invention of MEMS-CMOS inductor 200 wherein a MEMS inductor is implemented upon a CMOS chip 240. As shown a CMOS chip 240 has formed upon it a MEMS inductor comprising bottom conductor 230, structural layer 220, and top conductor 210. The top conductor 210 having two electrical contacts 215 which are interfaced to analog CMOS circuit 250 provided within the CMOS chip 240. Similarly bottom conductor 230 comprises two electrical contacts 235 which are electrically interconnected to analog CMOS circuit 250.

It will be evident therefore that the low-temperature CMOS-compatible flow according to an embodiment of the invention allows for deposition of metal, bottom conductor 230, before the structural layer 220 and hence provides the ability to route signals both on top and on the bottom of the electrically insulating structural layer. This added degree of signal routing freedom yields interesting design advantages. For example, it is possible for electrical isolation of simultaneous signals in a MEMS device such as the MEMS inductor of MEMS-CMOS 200 in FIG. 2. The possibility of isolating signals between two different metallization levels on the structural layer is a possibility of this process that is impossible if conductive structural layers are used. If the structural layer is conductive, the electrical potential of a device can only be set to one value and this may limit or constrain design freedom. However, through the non-conductive structural layer, signals may be isolated on the same side of the structural layer.

This process according to an embodiment of the invention allows the MEMS device to be added to the MEMS-CMOS 200 at the fully processed CMOS wafer, such post-CMOS MEMS processing imposing stringent requirements on the processing steps used to fabricate the MEMS devices. These requirements pertaining primarily to the destruction of electrical interconnect performance due to diffusion, agglomeration, spiking or dopant deactivation. Such issues are becoming increasingly important in sub-micron CMOS technologies due to junction depth decrease and interconnect size reduction. It is generally understood that CMOS compatibility implies processes follow some guidelines, see for example N. Dotson et al "Low Cost MEMS Processing Techniques" (Proc. ASEE/NCS Spring Conference, Kalamazoo Mich. (USA), April 2004). Most importantly, all processing steps must be undertaken at temperatures which are below 400° C. to prevent metallization and diffusion failures. This is a stringent temperature limit in conventional polysilicon-based MEMS processes. These rely on chemical vapor deposition (CVD) techniques which usually require high deposition temperatures for deposition of thick polycrystalline coatings. In addition, these deposition methods allow for no stress control, and high temperature annealing is often necessary to reduce intrinsic stresses or enable electrical properties through doping. Such high processing temperatures are not only CMOS incompatible, but hinder process performance as they prohibit any pre-structural layer metallization. As a result, even if deposition temperatures can be reduced by plasma enhanced chemical vapor deposition (PECVD) techniques; elevated temperatures are often still required to relieve intrinsic stresses and allow doping of the structural layer for good electrical operation. Hence, prior art MEMS processes that rely on polysilicon structural layers are inherently CMOS incompatible. The embodiments of the invention in contrast include providing a low temperature stress controlled deposition technique facilitating CMOS integration and providing versatility of this process.

Additional requirements on MEMS integration include contamination of the CMOS wafers which must be minimized and requires careful planning of processing steps such as etching. CMOS wafers must be well protected from MEMS processing while allowing for an efficient interconnect to be fabricated. Most of these requirements are nontrivial but attainable if the MEMS process uses standard CMOS-compatible wet etching solutions and dry etching etch stops as provided by embodiments of the invention.

Referring to FIG. 3A illustrated is a MEMS RF switch 300 according another application of the invention. The MEMS RF switch 300 exploiting the non-conductive structural layer such that signals may be isolated on the same side of the structural layer. As shown the MEMS RF switch 300 comprises an input microwave signal line 370 and an output microwave signal line 330 which are discontinuous. The switch contact 360 is formed on the underside of the contact flexure 320 that is formed from the structural layer material 340. The small bridge of the contact flexure 320 being supported at each side by capacitive actuators formed from upper metal contact 310A, lower metal contact 350 separated by the structural layer material 340. Upper metal contact 310A is actually formed on the lower side of the structural layer material 340 as is switch contact 360 and is electrically isolated due to the properties of the structural layer material 340, namely an insulator. This allows for electrical isolation of the microwave signal with respect to the actuation voltage required by the switch.

Hence, application of appropriate control signals to the upper metal contacts 310A and lower metal contacts 350 provides for capacitive actuation. However, in capacitive actuation "pull-in" may occur to cause a shorting of the actuation electrodes defined by upper metal contact 310 and lower metal contact 350. In order to prevent this an exemplary process flow for the invention to provide the MEMS RF switch 300 alternatively includes the use of a spin-on glass (SOG) dielectric layer added to cover the lower metal contact 350. The SOG dielectric layer acting as a DC block in the event of "pull-in" but allowing RF signal to propagate from the input microwave signal line 370 to the output microwave signal line 330 via switch contact 360.

This configuration being shown in FIG. 3B by actuated/non-actuated cross-section profile 3000. Accordingly in the upper portion of actuated/non-actuated cross-section profile 3000 the non-actuated profile shows the structural layer 340A without deformation along with the SOG layer 380 providing electrical isolation to the lower contact 350. The lower portion of actuated/non-actuated cross-section profile 3000 showing an occurrence of "pull-in" wherein the structural layer 340B has deformed and is now in contact with the SOG layer 380.

In typical CMOS integration flows, the process can be set atop of standard passivation or planarization layers such as phosphosilicate glass, silicon oxide, or nitride, and as such, in embodiments described subsequently substrate passivation may be explicitly described as part of the MEMS integration process but may be added without changing the basis of the embodiments of the invention.

Figure 4A:
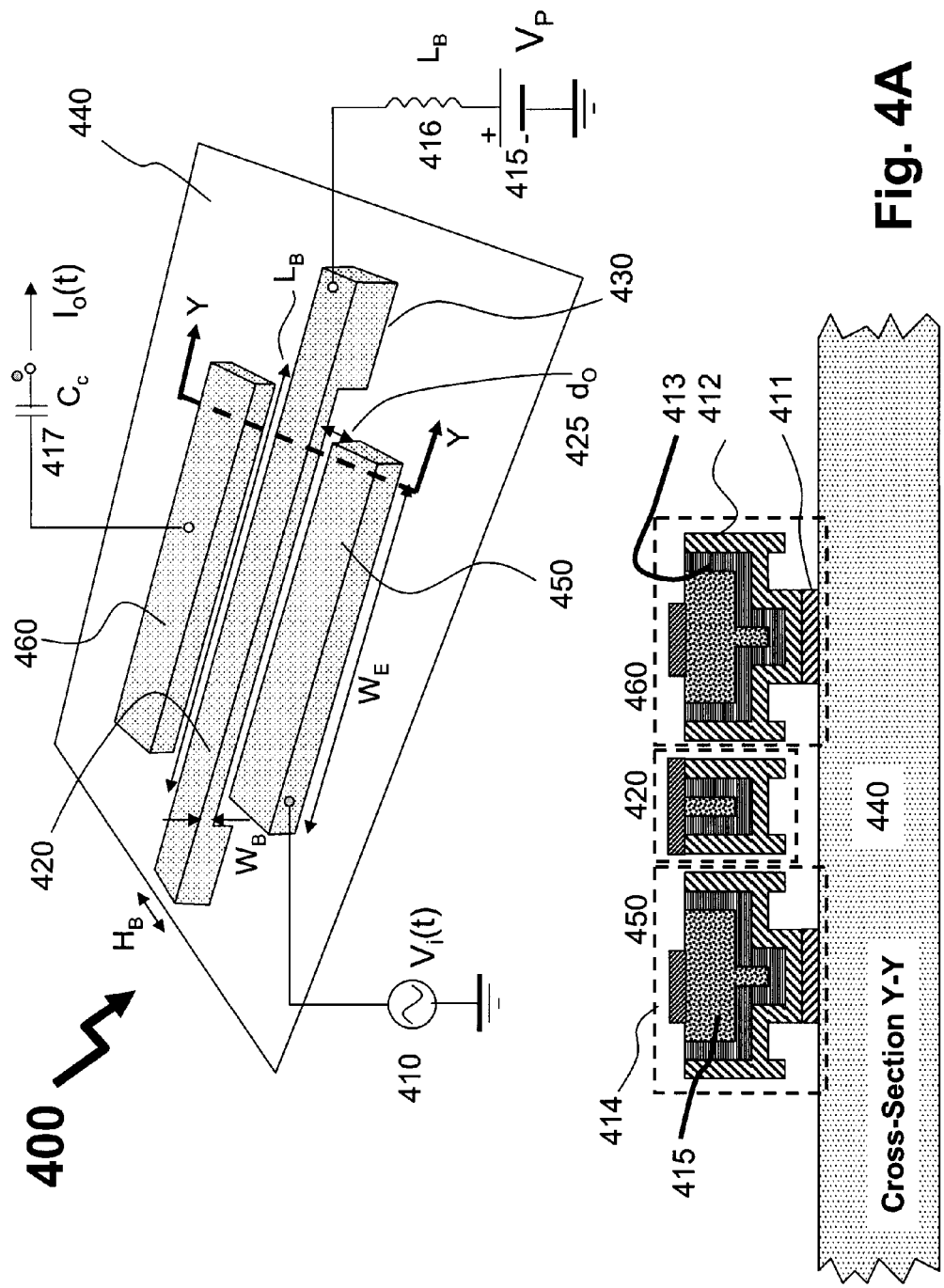
FIG. 4A illustrates an application of the invention to provide a clamped-clamped beam resonator with lateral gaps.

FIG. 4A illustrates a further application of the invention to provide a microelectromechanical (MEM) clamped-clamped beam resonator 400 with lateral gaps. Such a clamped-clamped beam resonator 400 allows the integration of RF MEM resonators with CMOS electronics. As would be apparent to one skilled in the art such devices also place particular requirements on the electrical and mechanical performance requirements of MEMS processes and particularly benefit from the integration of the RF MEM resonator directly with analog-digital CMOS electronics. For example, in wireless communications, micromechanical resonators are attractive components to use as intermediate frequency (IF) or image rejection filters as well as in frequency references. Current frequency references make use of quartz crystals which cannot be integrated with CMOS and are associated with high costs. MEM resonators fabricated in accordance with an embodiment of the invention could replace these quartz crystals as resonant elements, and simultaneously enable a low-cost and fully-integrated solution via their implementation on silicon CMOS circuits.

As resonant devices, MEM resonators have a transmission characteristic which is tuned to a specific excitation frequency. In RF applications, these resonant structures are usually electro-statically actuated, and hence exhibit an electrical transfer function analogous to that of a highly selective band pass filter. As signal processors, these can benefit integration in communication systems where bulky and costly off-chip high-quality filters may be replaced by MEM resonators that can be fully integrated to the underlying electronics. MEM resonators, are also a significant enabling element of many sensing applications including, gas, vibration, ultrasound, chemical, and biological sensing. Biomedical applications extend into domains such as artificial cochlear implants. This large spread of applications makes resonators a critical building block candidate of any CMOS compatible MEMS process. MEM resonators are based on structures' mechanical resonant modes, related to the material properties of the MEMS structural materials, and therefore benefit from high Young's modulus and low density as outlined in respect of FIG. 1, and are subject to few energy loss mechanisms that enable these devices to resonate with very high Q-factors.

The clamped-clamped beam resonator 400 with lateral gaps is shown implemented onto a silicon substrate 440 within which CMOS electronics would be implemented (not shown for clarity) to utilize the resonant electrical behavior of the clamped-clamped beam resonator 400. The resonant beam 420 being mounted between first and second lateral beams 450 and 460 and attached to the silicon substrate by landings 430. Each of the first and second lateral beams 450 and 460 being metalized to provide electrical contacts positioned beside the resonant beam 420. The clamped-clamped beam resonator 400 is based upon capacitive transduction. As such a signal input $v_i(t)$ from source 410 is applied to first lateral beam 450 and a DC voltage $V_P$ 415 via AC blocking inductor 416 is applied onto the resonant beam 420. This DC bias voltage $V_P$ 415 and signal input $v_i(t)$ from source 410 are effectively applied across the capacitor formed by the resonant beam 420 and the first lateral beam 450 across the gap $d_o$ 425 creating an electrostatic force, which is balanced by the spring force of the beam. Once in resonance, the resonator sources an output current from the second lateral beam 460 via the capacitor 417:

$$i_o \cong \frac{\varepsilon_o W_E W_B}{d_0^2} \frac{\delta x}{\delta t} V_p \quad (3)$$

where x represents the resonator beam's 420 displacement, $\varepsilon_0$ the permittivity constant, $W_B$ the width of the beam, $W_E$ the width of the first and second lateral beams 450 and 460, and the gap $d_o$ 425 between the first lateral beam 450 and lateral surface of the resonant beam 420. As for the resonant frequency of the beam, it is defined by its shape and composition. In the case of a clamped-clamped beam resonator 400, neglecting the electrical spring force, the mechanical resonant frequency $f_o$ can be expressed as:

$$f_o = \frac{1}{2\pi} 2\sqrt{\frac{k_r}{m_r}} \cong 1.03 \sqrt{\frac{E}{\rho}} \frac{H_B}{L_B^2} \quad (4)$$

where $H_B$ defines the beam thickness, $L_B$ the beam length, E the beam's material Young's modulus and $\rho$ it's density. This equation motivates the use of high acoustic materials such as SiC for high frequency operation of MEM resonators.

Now referring to cross-section Y-Y of FIG. 4A the resonator beam 420 first and second lateral beams 450 and 460 are shown. As shown the first and second lateral beams 450 and 460 comprise a lower metallization 411 interfacing to the silicon substrate 440. The first and second lateral beams 450 and 460 then comprising first metallization 412 and second metallization 413 which transition from substantially the plane of the silicon wafer to substantially perpendicular to the silicon wafer and provide wrap-around metallization to the sidewalls of first and second lateral beams 450 and 460. The bulk of the first and second lateral beams 450 and 460 comprising a ceramic structural layer 415, SiC for example. Finally a top metallization 414 is provided, allowing the top surface of the first and second lateral beams 450 and 460 to be used for electrical interconnects, heaters, and other electrical structures according to the requirements of the MEMS devices being fabricated. The resonator beam likewise comprises first metallization 412 second metallization 413, and ceramic structural layer 415 with top metallization 414. For the resonator beam 420 the top metallization allows the structure to have, for example a thin film heater for tuning the resonant frequency of the resonator beam 420 applied (not shown for clarity).

Figure 4B:
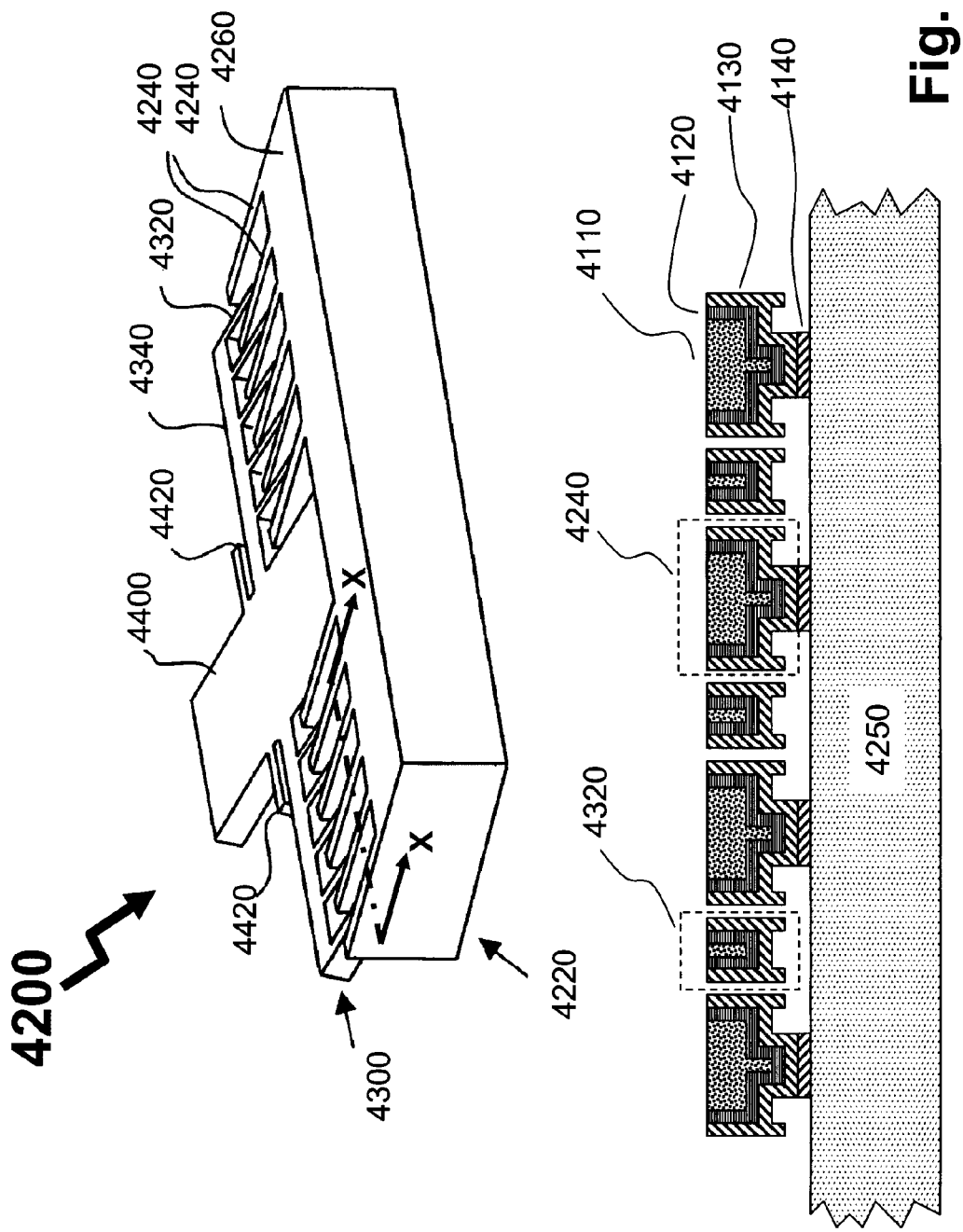
FIG. 4B illustrates an application of the invention to provide a MEMS comb drive.

Referring to FIG. 4B there is shown another application of the invention with respect to a Staggered Torsional Electrostatic Combdrive (STEC) 4200, which is illustrated in an activated state. This state is achieved by applying a voltage between the moving comb drive teeth assembly 4300 and the stationary comb teeth assembly 4220, which are attached to anchor 4260. In this state, the individual comb drive teeth of the two assemblies interdigitally disposed. The applied voltage attracts the moving comb drive teeth assembly 4300 to the stationary comb teeth assembly 4220, thus exerting torque on the torsional hinges 4420, forcing the beam 4400 to tilt. The fingers 4320 formed between grooves 4240. The torsional hinges 4420 which are anchored, the anchor points not shown for clarity, provide restoring torque when the voltage is removed. The beam 4400 may be part of a variety of structures including micro-mirrors, micro-mechanical actuators, optical read-write assembly etc.

In some instances a plurality of STEC 4200 may be joined to a single plate as part of the MEMS device. In such instances the plurality of beams 4400 may require electrical contacts or circuitry on their upper surfaces such to connect to the single plate, for example when the micro-mechanical actuator is part of an electrical switch or optical read-write assembly. As a result it would beneficial for electrical circuits to be brought to the upper surface of the beam 4400 or plate, not shown for clarity, connected to the beam 4400 from the lower surface by wrapping the metallization around the edges. Obviously, the STEC 4200 itself requires the ability to form a plurality of lateral features thereby delineating the fingers 4320 of the moving comb drive teeth assembly 4300 and grooves 4240 of the stationary comb teeth assembly 4220.

Now referring to the cross-section X-X of FIG. 4B the structure of an exemplary embodiment of the fingers 4320 and grooves 4240. The grooves 4240 being part of stationary comb drive teeth assembly 4220 are attached to the silicon substrate 4250 by lower metallization pads 4140. The grooves 4240 comprising first metallization 4130 and second metallization 4120 that wrap around the vertical sidewalls and lower surfaces of ceramic structural layer 4110. The fingers 4320 being part of moving comb drive teeth assembly 4300, are similarly comprised of comprising first metallization 4130 and second metallization 4120, and ceramic structural layer 4110. However, by not patterning the lower metallization pads 4140 underneath these fingers 4320 they have been released from the silicon 4250 from the processing sequence, thereby allowing them to move under the electrostatic attraction from the applied voltage between the fingers 4320 and grooves 4240. The first metallization 4130 and second metallization 4120 providing improved conductivity from the voltage source to the fingers 4320 and grooves 4240.

Figure 4C:
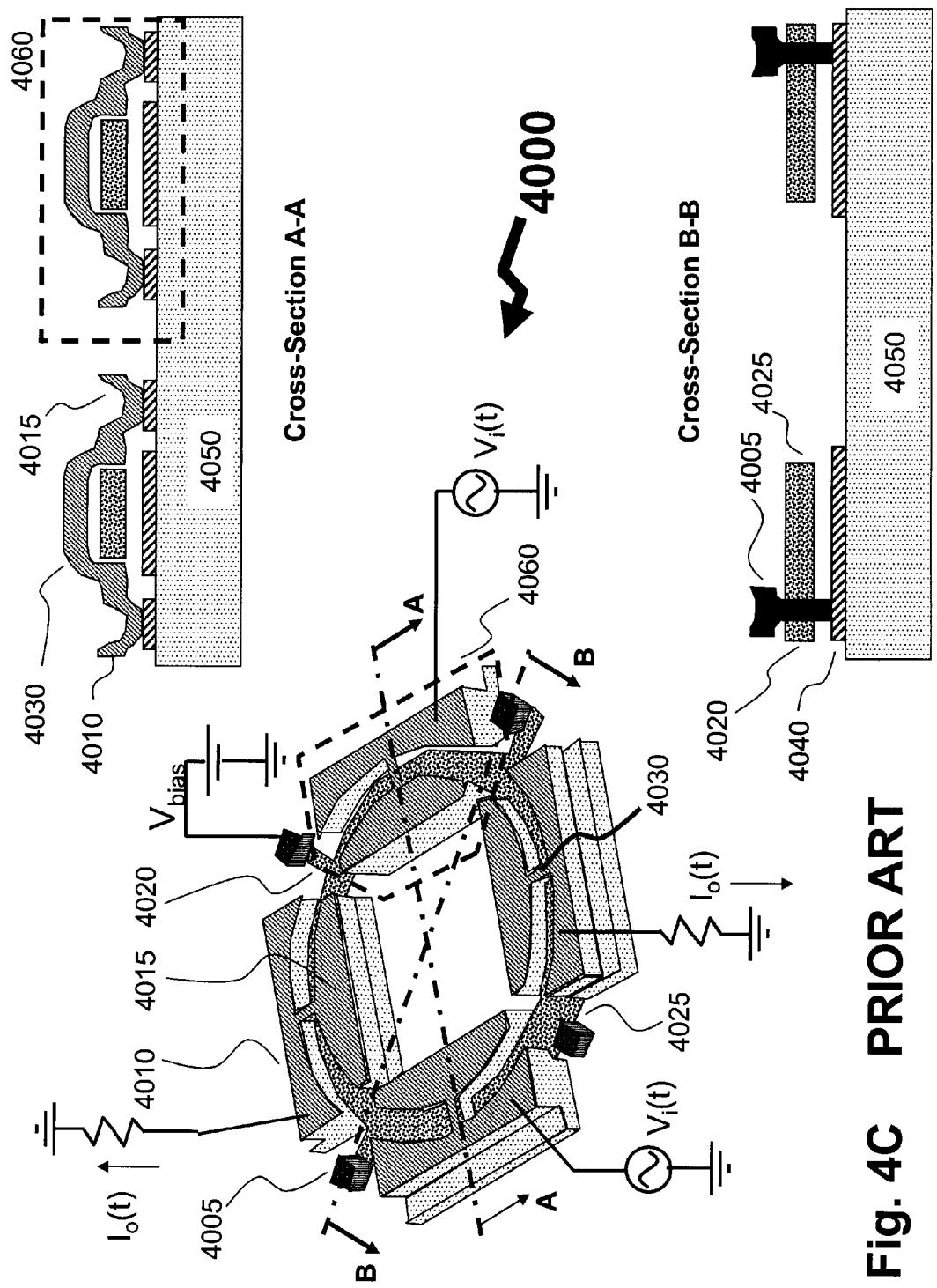
FIG. 4C illustrates a bulk acoustic wave resonator according to a MEMS process according to F. Nabki et al.

Referring to FIG. 4C there is shown a bulk acoustic wave (BAW) resonator 4000A according to the prior art of Y. Xie et al ("UHF Micromechanical Extensional Wine-Glass Mode Ring Resonators'", Technical Digest, 2003 IEEE International Electron Devices Meeting, Washington, D.C., Dec. 8-10, 2003, pp. 953-956). The BAW resonator 4000 comprises resonator ring 4025 being an annular structure released away from the substrate over the majority of its periphery with the exception of four anchors 4005, spaced at 90 degrees separation to each other, and are connected via support beams 4020. Disposed around the remaining periphery of the resonator ring 4025 are four electrode structures 4060. Each electrode structure comprising an outer electrode 4010 and an inner electrode 4015 with a metallization bridge 4030 interconnecting the two. Accordingly to excite the BAW resonator 4000 a DC-bias ($V_{bias}$) is applied to the resonator ring 4025 and an AC voltage is applied to one pair of diametrically opposed electrode structures 4060. Together, these voltages generate an electrostatic force at the frequency of the applied AC voltage that drives the device into resonance vibration when the drive frequency matches the resonant frequency of the resonator ring 4025. Once vibrating, DC-biased (by $V_{bias}$) time varying electrode-to-resonator capacitors generate currents that serve as the device output. These are coupled from the second pair of diametrically opposed electrode structures 4060, these being those 90 degrees rotated from those providing the applied AC drive voltage.

Figure 4D:
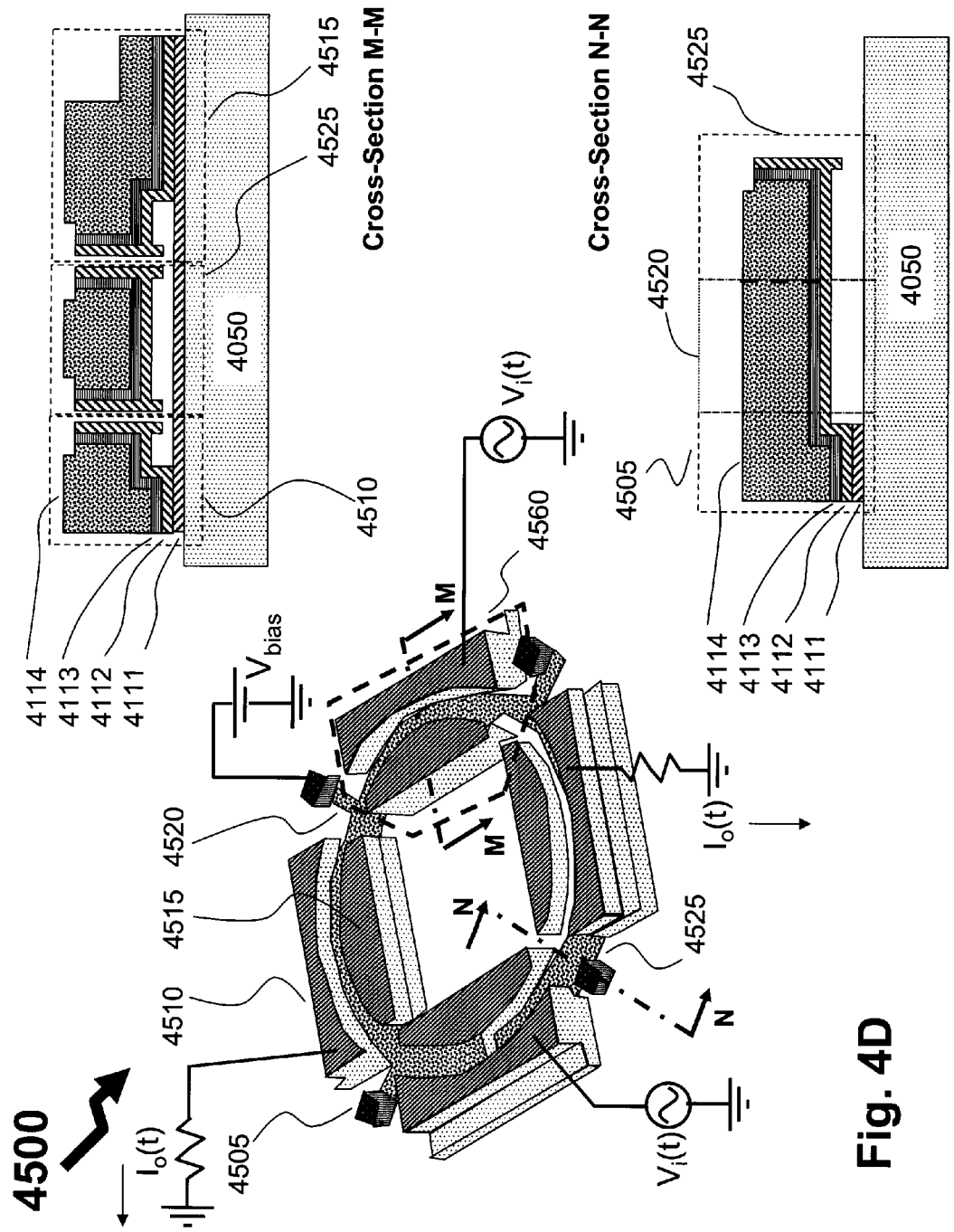
FIG. 4D illustrates a bulk acoustic wave resonator fabricated according to an exemplary process of the invention.

An embodiment of the BAW resonator 4000 of Xie et al according to an aspect of the invention is shown in FIG. 4D as BAW device 4500. Structurally the BAW device 4500 is very similar to the BAW resonator 4000 in that it comprises a resonator annulus 4525 which is similarly anchored at four anchors 4505 that interconnect to the resonator annulus 4525 via support beams 4520. The support beams 4520 designed to reduce coupling from the resonator annulus 4525 to the anchors 4505 which acts as a loss mechanism for the BAW device 4500. Disposed around the resonator annulus 4525 are four electrode structures 4560 which now only comprise inner electrode 4515 and outer electrode 4510.

As shown in first cross-section M-M each of the inner electrode 4515, outer electrode 4510 and resonator annulus 4525 are comprised of three layers. The lowermost being first metallization 4112, followed by second metallization 4113, and ceramic structural layer 4114. The inner electrode 4515 and outer electrode 4510 are mounted to the silicon substrate 4050 via lower metallization 4111 which also provides for electrically connecting the matching inner electrode 4515 and outer electrode 4510.

Referring now to second cross-section N-N which is at an angle 45 degrees away from the first cross-section M-M then we see the exemplary design of the anchors 4505 and the attachment of the resonator annulus 4525 via the support beams 4520. Unlike Xie et al the three elements are really one continuous structure formed from the same three materials as the inner electrode 4515 and outer electrode 4510 as discussed supra in respect of the first cross-section M-M. Hence, the anchors 4505, resonator annulus 4525, and support beams 4520 are formed from first metallization 4112, second metallization 4113, and ceramic structural layer 4114. The anchor 4505 being differentiated by the presence of the lower metallization 4111 attaching that portion of the structure to the silicon substrate 4050.

As described below in respect of FIG. 5, and supra in respect of the resonator beam 420 of FIG. 4A, STEC 4200 of FIG. 4B, and BAW resonator 4000 of FIG. 4D, and for a MEMS compatible process onto a Si CMOS device to be successful then a critical aspect relates to the method of forming the structural material with consideration for:
   intrinsic stress control for low stress films to prevent structural buckling or fracture,
   ability for small (<200 nm) gap to allow for effective electrostatic coupling,
   CMOS-compatible deposition temperature, and
   low-cost deposition technology that allows for manufacturability.

Based upon material selection chart 100 it is evident that SiC, $Al_2O_3$ (alumina), diamond, and potentially $Si_3N_4$ (silicon nitride) offer enhanced MEMS performance to prior art silicon. In considering SiC, a critical aspect of the implementation of MEMS devices is the deposition of the core structural SiC layers. Within the prior art SiC has been traditionally deposited using one of four different methods:
   1) low-pressure chemical vapor deposition (LPCVD);
   2) atmospheric pressure chemical vapor deposition (APCVD);
   3) plasma-enhanced chemical vapor deposition (PECVD); and
   4) magnetron enhanced sputtering.

Both LPCVD and APCVD have been used to successfully deposit SiC films; however, these reactions are usually highly endothermic and yield poor stress control, hence requiring deposition temperatures typically of 800° C. to 1300° C. As a result of these high temperatures, no method to date has allowed for post-CMOS integration using APCVD or LPCVD of SiC. Furthermore, the deposition rate is typically very low since the overall reaction is limited by the surface reaction rate.

PECVD which uses RF-induced plasma to transfer energy to the reactant gases allows the substrate to remain at a much lower temperature. Using this technique, low temperature deposition is possible. The composition of SiC deposited at these relatively low temperatures is amorphous or polycrystalline with crystal grains present in more quantity when the deposition temperature is increased. Residual stresses in deposited films, however, are typically very high, and therefore a CMOS incompatible post-deposition high temperature anneals is required.

For SiC deposition to provide structural layers in MEMS, the inventors have demonstrated that by exploiting DC magnetron enhanced sputtering not only can the processing be performed at room temperature, but that this can yield good stress control and no special CVD processes are required. DC sputtering may also used for all metal depositions for upper and lower metallizations to the ceramic layer demonstrating a significant minimization in the amount and cost of equipment needed to implement the process, and render it less hardware dependant for enhanced manufacturability. Sputtering is typically performed by bombarding a SiC target with positive argon ions created in a plasma. These incident ions sputter away material by physical momentum transfer, which then condenses onto the substrate. Since this is a purely physical process, no external heat source is required and the process can be performed at room temperature; however, the substrate temperature will rise marginally due to bombardment by secondary electrons, and neutral atoms. As a result according to embodiments of the invention the maximum temperature of the substrate measured may be limited to below 200° C., which is considerably lower that most CVD processes, and can be reduced further at the cost of lower throughput if thermal relief pauses are taken during deposition. Another advantage of physical sputtering is that deposited films are conformal and adhere well to the substrate. It has a relatively high deposition rate, and residual stresses can be nearly eliminated by careful selection of the process parameters.

Further, the embodiments of the invention provide for a low temperature MEMS structural deposition process that is relatively simple, low-cost, and can be performed using only argon gas and a sintered SiC target. Beneficially the SiC from the process is amorphous, has isotropic material properties, maintains its high elastic modulus, hardness and inertness but is non-conductive thereby allowing the isolation of electrical contacts on one surface or between top and bottom surfaces as discussed supra in respect of FIGS. 2 and 3. According to embodiments of the invention, the interconnects are metal-based in order to maintain the low thermal loading to the Si CMOS circuits. This has the added benefit of lower resistance interconnects as metal conductivities are orders of magnitude better than doped semi-conductors, and achieves low resistive energy losses that improves quality factor performance of devices such as MEMS variable capacitors, switches, inductors or resonators. Alternatively, in other embodiments with reduced thermal constraints doping can be employed to provide the interconnects to the SiC structural elements.

Figure 5B:
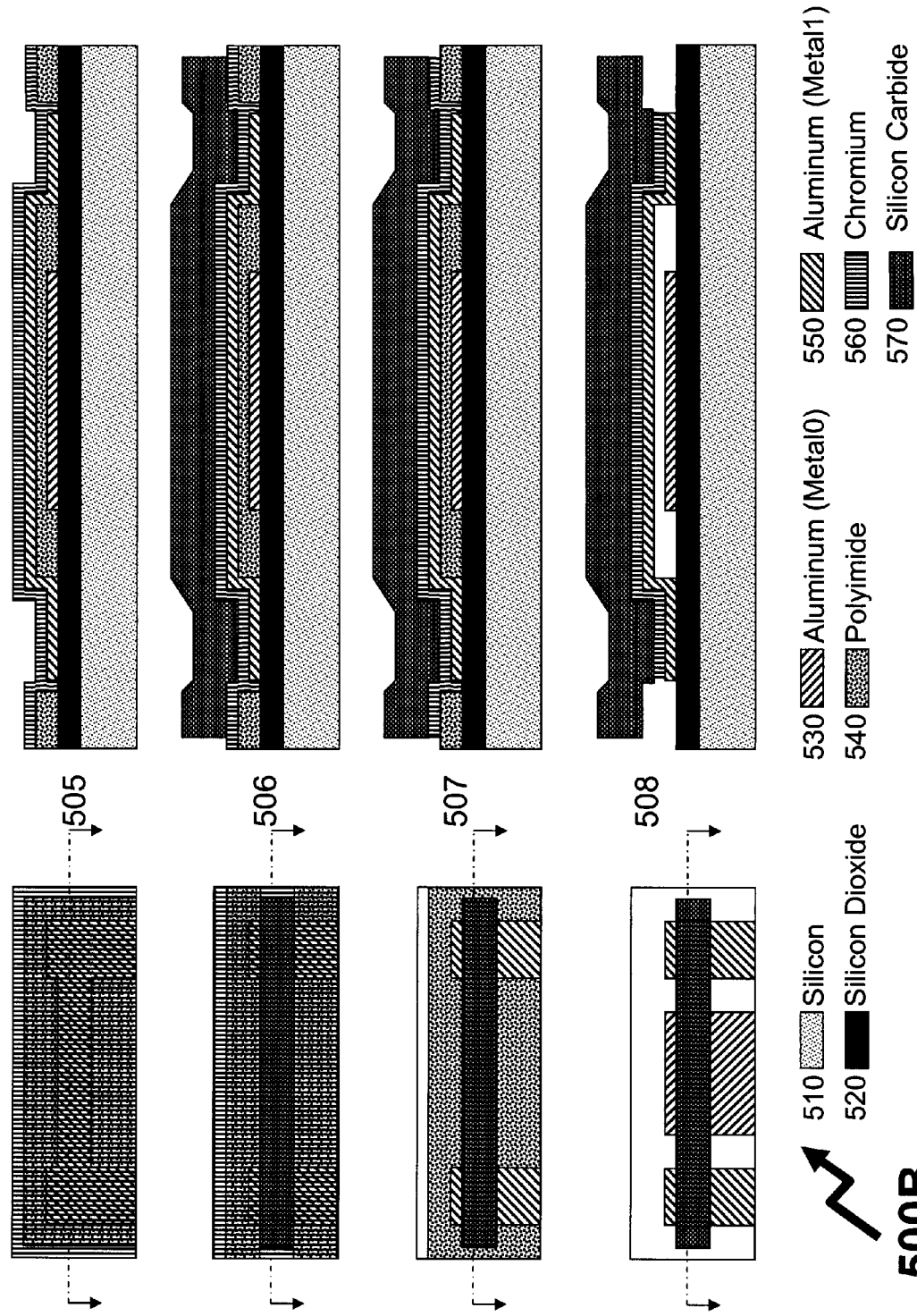

A manufacturing process flow is presented in respect of FIGS. 5A and 5B, illustrating a method of providing SiC based MEMS devices onto Si CMOS electronics according to the work of F. Nabki et al ("A Low-Temperature (<300° C.) Silicon Carbide Surface Micromachining Fabrication Technology for Micromechanical Resonators", Hilton Head Workshop 2008: Solid-State Sensors, Actuators and Microsystems Workshop, Paper P23). Referring to FIG. 5A the initial process steps are shown in plan and cross-sectional views 500A. In first step 501 the silicon wafer 510 is coated with a 2.5 µm layer of silicon dioxide 520 to reduce electrical feed-through from the electrical interconnects of the MEMS structure to the Si CMOS within the silicon wafer 510. This layer can be removed in another embodiment of the invention when applied directly onto a processed CMOS substrate's passivation or planarization layer such as phosphosilicate glass, silicon oxide, or nitride. In the second step 502 interconnect/ground metallization is formed onto the upper surface of the 2.5 µm layer of silicon dioxide 520 by depositing 60 nm of aluminum (Metal 0) 530 and wet etching to form the electrical pattern required.

Next in the third step 503 a 0.2 µm polyimide layer 540 is deposited and patterned. The 0.2 µm polyimide layer 540 being sacrificial to release the MEMS resonator as finally formed. On top of the sacrificial polyimide layer 540 further 60 nm aluminum layer (metal 1) 550 is deposited and patterned in step 504. The 60 nm aluminum layer (metal 1) 550 forming the lower side metallization of the MEMS structure, in this case the beam interconnect layer.

Now referring to FIG. 5B the final process steps are shown in plan and cross-sectional views 500B. Next at step 505 an 80 nm SiC etch-stop blanket layer of chromium layer 560 is deposited across the surface of the wafer. Next in step 506 a 2 µm SiC MEMS structural layer 570 is deposited and patterned using reactive ion etching in a $NF_3$ environment. At this point an aluminum layer for pad creation or interconnect resistance reduction can be patterned. Next in step 507 the exposed chromium layer 560 is etched using a conventional wet etchant. Finally in step 508 the polyimide sacrificial layer 540 is removed from the wafer using a dry oxygen plasma process. The result in the embodiment described being to release the beam in this example of the MEM resonator. The release etch also removes any remaining exposed chromium layer 560 from under the SiC MEMS structural layer 570 where no aluminum layer (metal 1) 550 is patterned.

Figure 8A:
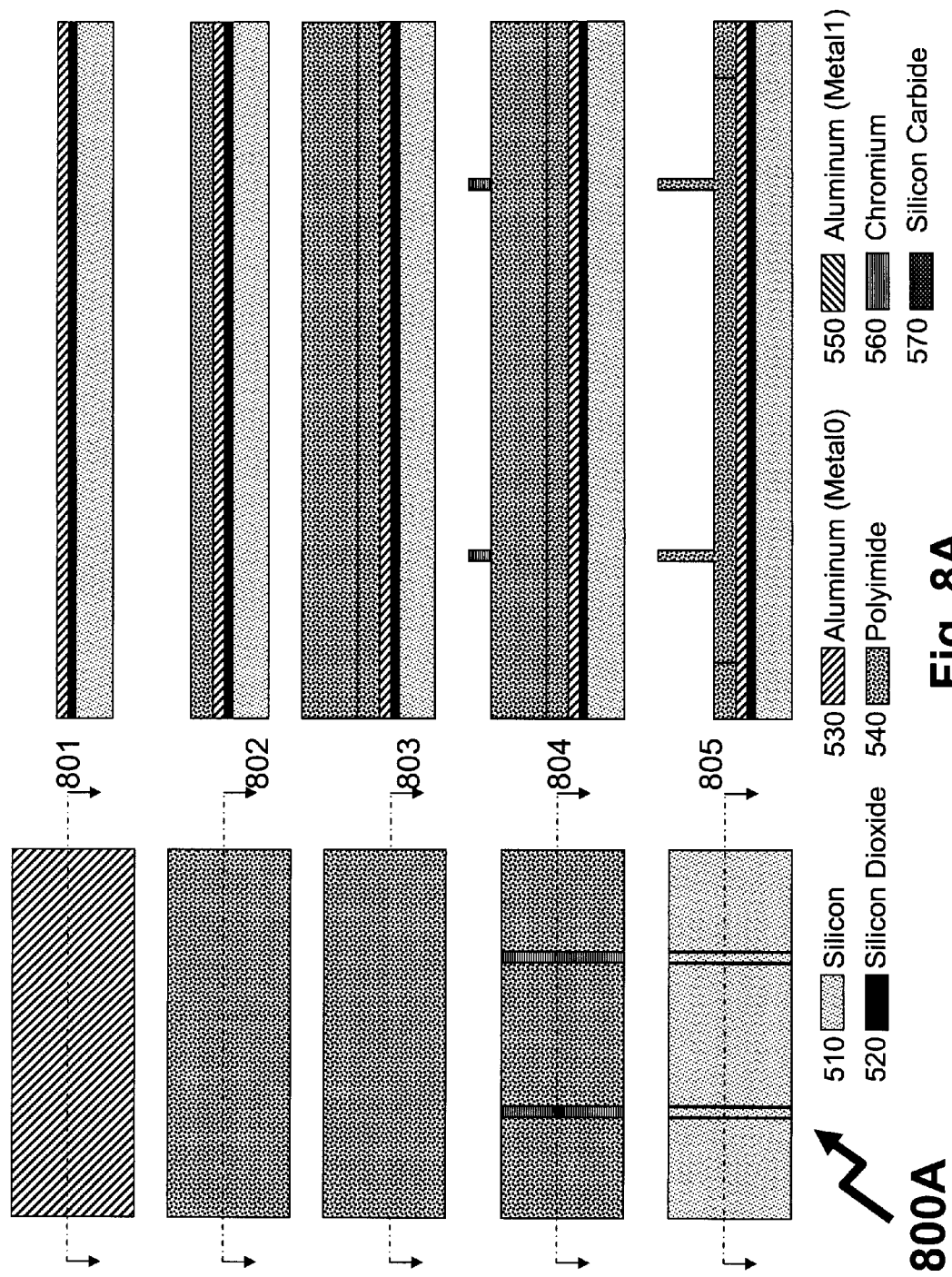
Figure 8B:
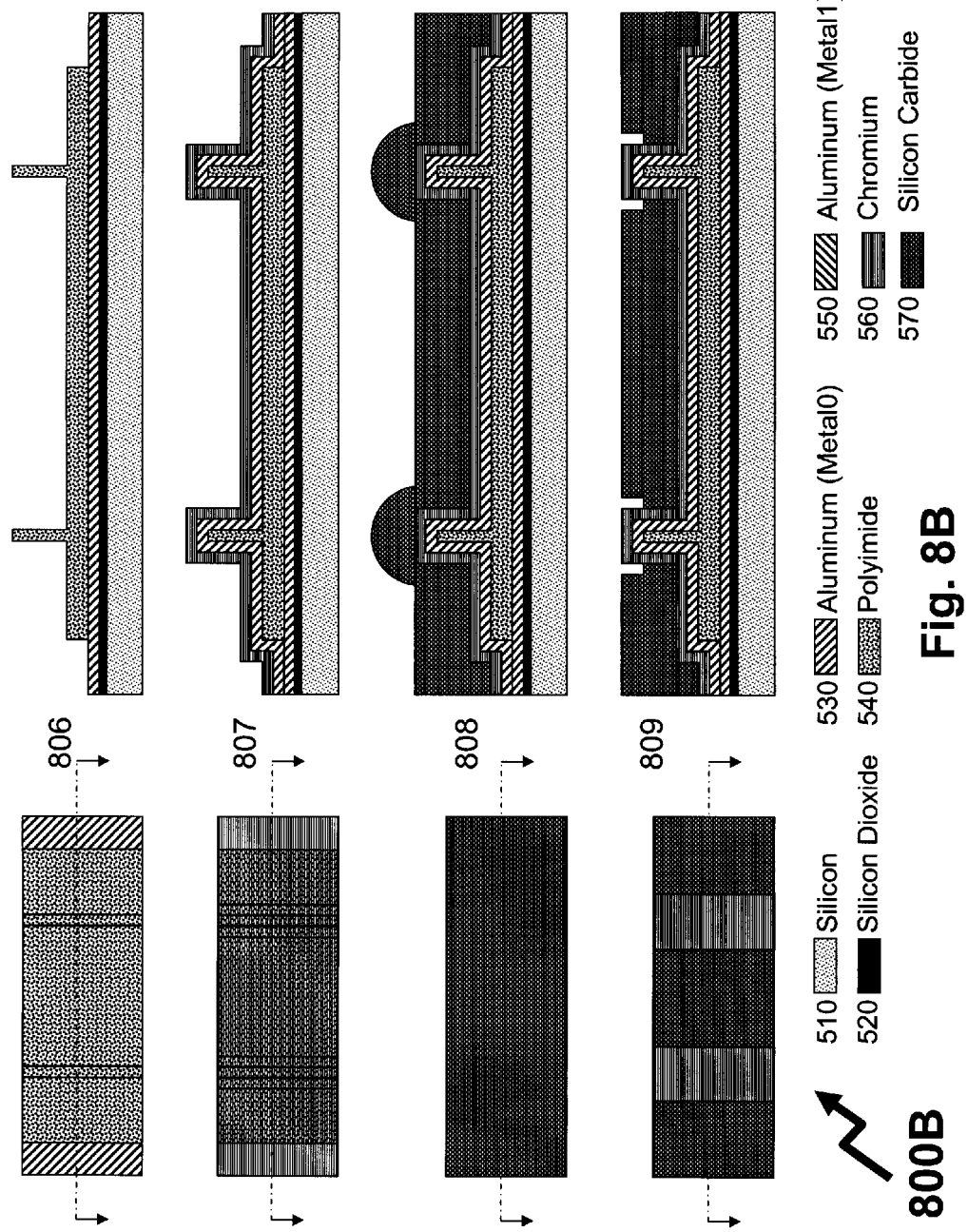

It will be evident that the exemplary process flow presented in respect of FIGS. 5A and 5B provides for three metal layers for routing signal and actuation voltages, one being the aluminum (metal 0) 530 direct to the Si CMOS substrate surface, the second being aluminum (metal 1) 550 on the underside of the SiC MEMS structural layer 570, and the third being a metal 2 layer formed onto the upper surface of the SiC MEMS structural layer 570. Such a metal 2 layer not shown within the embodiment presented. However, the process flow as presented does not provide for patterning and defining lateral structures. Such a process flow is shown in FIGS. 8A through 8C, and presented subsequently.

Further the exemplary embodiment presented in respect of FIGS. 5A and 5B being a MEMS resonator is just one possible application of the process where flexibility of three metal layers and SiC MEMS structural layer exist. Optionally the aluminum may be replaced with tungsten or other electrical interconnect materials in dependence upon the environmental and chemical aspects of the environment within which the MEMS device is intended to operate.

Optionally, if required, and as subsequently in respect of FIG. 7, a 0.4 µm aluminum layer 710 can be added to the process flow if necessary to serve as the structural layer's 730 top interconnect. This layer can be patterned after the SiC patterning or, if the entire top of the SiC may be metalized, it can be self-aligned to the SiC layer by patterning it after the chromium mask 720 such that a two-layer mask comprising of aluminum layer 710 and chromium mask 720 masks the SiC 730.

It will be apparent that the provision of electrical interconnections and structures on the lower side of the MEMS structural layer is particularly novel and beneficial aspect of the invention that is not present in prior art MEMS processes. Optionally the approach benefiting any non-conductive structural layer. Alternatively the metallization-structural layer-metallization structure may be expanded to other combinations and multiple repetitions of the sandwich structure provided the upper temperature limits of the Si CMOS compatible process are not exceeded. According the flexibility to provide full metal—structural layer—metal sandwich structures together with the partial variants of lower metal—structural layer and structural layer—upper metal, allowing the full scope of the Si CMOS compatible MEMS process to be exploited in providing any MEMS device including but not limited to RF switches with signal isolation, tunable inductors, tunable capacitors, RF resonators and tuned RF resonators.

In the following sections aspects of the exemplary embodiments are discussed in respect of aspects of the SiC MEMS layer.

Deposition: The SiC MEMS structural layer 570 according to embodiments of the invention was deposited using DC magnetron enhanced sputtering at a range of powers from 300W to 2000W and under varying chamber pressures of 3 mTorr to 25 mTorr. An exemplary deposition process, resulting film thickness, and resultant film stress are outlined below in respect of Table 1. It would be apparent to one skilled in the art that other deposition regimes for DC magnetron sputtering exist without departing from the scope of the invention for low temperature deposition of SiC. Typical deposition rates being 75 nm/min from these DC magnetron conditions. Optionally, other deposition techniques may be employed without departing from the scope of the invention provided their maximum substrate temperature does not exceed 400° C., and preferably below 300° C.

TABLE 1

Exemplary Deposition Process for SiC Structural Layer

| Process Parameter | Value |
| --- | --- |
| Power (kW) | 2 |
| Pressure (mTorr) | 6 |
| Scan Speed (cm/min) | 5 |
| Scans | 9 |
| Tensile Stress (MPa) | 20 |
| Thickness (µm) | 2 |

Referring to FIG. 6, the residual stress from SiC MEMS structural layer 570 deposition is presented as a function of chamber base pressure during DC magnetron sputtering. As is evident the approach allows reproducible deposition of thick SiC films with residual stress below ±50 MPa. Alternatively the process provides for the controlled adjustment of stress from tensile through to compressive allowing formation of low temperature silicon carbide devices with designed stress requirements for the SiC MEMS structural layer 570 or matching stress properties of upper layers of the electronic device materials onto which the SiC MEMS structural layer 570 is to be fabricated.

Etching: In general, the patterning of SiC MEMS structural layer 570 is much more difficult than other commonly used semi-conducting materials because of its low reactivity. Due to the strong inter-atomic bond of the silicon and carbon atoms (1.34 times stronger than a Si—Si bond), etching using aqueous solutions must be performed at temperatures greater than 600° C., which makes wet etching impractical for the low-temperature process according to the invention. As a result, patterning according to embodiments of the invention for the SiC MEMS structural layer 570 is undertaken using dry processing techniques such as reactive-ion-etching and lift-off. Using lift-off is an attractive method since it can be used to pattern any type of material. In this technique, SiC is first non-conformally deposited over a high-aspect ratio pre-formed mold. Next, the temporary mold is then removed using a wet etch, which lifts-off the unwanted SiC and leaves the patterned structure behind. Even though this method yields good results, it is still quite involved and necessitates the use of multiple steps and sacrificial materials.

Accordingly, dry plasma-based techniques such as reactive ion etching (RIE) provide the simplest technique to pattern the SiC MEMS structural layer 570. The rate of the overall etch process is dependant on many factors which include pressure, RF power, gas flow rate, DC bias, cathode temperature, and gas chemistry. These parameters can be optimized to obtain highly anisotropic etch profiles for SiC and sustain high etch rates, >2000 Å/min. To increase the etch rate further, the RIE chamber can be magnetically enhanced (ME).

Mask: In order to etch the SiC MEMS structural layer a mask must be provided onto the upper surface. Since the etch within the RIE is $NH_3$ based the lower tendency of chromium to form involatile etch products with fluorine has been exploited in establishing a novel two-layer metallic mask for the etching of the SiC MEMS structural layer. As shown in FIG. 7 the masking structure 700 is formed after the SiC structural layer 730 and comprises a 2000 Å layer of aluminum 710 which is followed by a 5000 Å layer of chromium 720. According to an embodiment of the invention the chromium 720 is first patterned with a conventional wet-etch, for example Cyantek Cr-14, which then forms the RIE etch mask for the SiC MEMS structural layer. The structure is then wet etched using Phosphoric-Acetic-Nitric acids (PAN), which does not attack chromium 720 but etches away the aluminum 710. By timing this process appropriately, the aluminum can be over-etched to provide a slight undercut 740 beneath the chromium 720, thereby preventing aluminum 710 sputtering during the RIE etch, thereby improving the sidewall quality while still yielding an aluminum top metallization.

The masking process described supra for masking the SiC exploits chromium to reduce micro-masking effect, and thus reduce post-etch residue. Alternatively, an aluminum top conductive layer alone can be employed as mask where such micro-masking effects are not critical limits to the MEMS performance. The novel bi-layer mask of chromium and aluminum to pattern the SiC allows the low temperature MEMS process to mitigate micro-masking effects whilst patterning both the SiC and the top interconnect in one process step. The bi-layer mask of chromium-aluminum may be replaced with any two metal material combination to create the top electrical interconnect and etch the structural layer provided it meets the requirements of deposition temperature, process compatibility, etch resilience, etch rate and etch quality. It would be apparent to one skilled in the art that the bi-layer mask provides enhanced cost benefits in the low temperature Si CMOS compatible MEMS process.

Etch Stop: For optimal manufacturability, the etching of thick, inert SiC MEMS structural layers requires the inclusion of an etch-stop into the mechanical stack of materials of the process structure according to embodiments of the invention. Table 2 below presents the etch rates under typical RIE process parameters for the material discussed with respect to the embodiments of the invention, namely SiC 730, aluminum 710, and chromium 720.

TABLE 2

Exemplary Etching Process and Etch Rates for Key Materials

| Process Parameter | Value |
| --- | --- |
| Etch Gas | $NF_3$ |
| Gas Flow Rate (sccm) | 15 |
| RF Power (W) | 400 |
| Pressure (mTorr) | 6 |
| Magnetic Field (G) | 65 |
| SiC Etch Rate (Å/min) | ~2075 |
| Al Etch Rate (Å/min) | ~425 |
| Cr Etch Rate (Å/min) | ~200 |

Accordingly, 800 Å being typical of the etch stop employed as chromium layer 560 within FIG. 5B. It should be evident that the use of a metal layer under the structural layer as an etch stop is part of the novel low temperature Si CMOS compatible MEMS process according to embodiments of the invention, and as such is an integral part of the process which is possible because the process is low temperature. One of the main difficulties when using SiC, is the lack of a robust etch stop in most processes; for example, the etch rate of SiC when using RIE is usually about the same order of magnitude as for silicon oxide, silicon nitride and poly-silicon. Thus, the etch rate must be tightly controlled in order to prevent damage to underlying layers. This aspect of the invention beneficially allows a more uniform and repeatable etch, and the protection of the underlying sacrificial layer and bottom interconnect layer to subsequent etches. Also importantly, it allows for the subsequent release of free elements of the MEMS without polyimide fluorination problems caused by the $NF_3$ SiC etch.

Sacrificial Layer: The sacrificial material is used to create the gap between the SiC MEMS structural layer and actuation electrodes or structures on the typically Si CMOS substrate. Since different types of RF MEMS devices have different requirements, the thickness of this layer should be easily adjusted; for example, RF MEMS resonators such as clamped-clamped beam resonator 400 of FIG. 4 require a very tightly-controlled thin gap on the order of 100 nm ($d_o$), while inductors such as MEMS-CMOS inductor 200 typically require a large gap (>5 µm) to reduce coupling to the substrate. Thus, the deposition rate must be accurately controlled, while still being relatively large to reduce processing time. Secondly, this layer must be easily removed using isotropic etching techniques that do not adversely affect the other materials in the device. Wet etchants are commonly used to release most MEMS devices as they are cost effective and multiple wafers can be easily batch processed.

However, a main drawback of wet etching the sacrificial layer is that capillary forces can pull free-standing structures down to the substrate after the wafer is dried. This effect, called stiction, can render a large portion of devices inoperable. Another more attractive release method is to use a dry plasma based etch. Since the etch takes place in a vacuum, no special rinsing and drying procedures to prevent stiction are required after release. In both cases, however, the release step must be highly selective to the sacrificial material and thus, in this work, should not etch either aluminum or silicon carbide. SiC does not etch easily in aqueous solutions and is relatively inert, however, aluminum is readily etched by many commonly used release etchants such has hydrofluoric acid (HF). Also, since this process is intended for integration with CMOS, ideally the etchant should be what is termed 'oxide compatible' to ensure that the underlying electronics are not damaged by the release step. As such, the etchant should not attack common CMOS passivation or planarization layers such as phosphosilicate glass, silicon oxide, or nitride.

Now referring to FIG. 8A the initial process steps are shown in plan and cross-sectional views 800A. In first step 801 a silicon wafer 510 is provided, the silicon wafer 510 may contain CMOS electronics or it may not, and coated with metallization, such as aluminum (metal 0) 530. The metallization allowing the electrical interconnection of MEMS elements such as shown supra in respect of lower metallization 4111 without recourse to air bridges and other complex electrical interconnects from prior art processes that do not support metallization beneath the structural layers of the MEMS device. Whilst shown as a blanket deposition in step 801 this may be a deposition and patterning step such that the metallization provides the required electrical interconnection pattern for the MEMS device.

The aluminum (metal 0) 530 being deposited directly where the silicon wafer 510 is a processed CMOS substrate and hence there is present a passivation or planarization layer such as phosphosilicate glass, silicon oxide, or nitride. Optionally a 2.5 µm layer of silicon dioxide 520 to reduce electrical feed-through from the electrical interconnects of the MEMS structure to the Si CMOS within the silicon wafer 510 may be applied prior to the metallization in step 801. Next in step 802 the metalized silicon wafer is coated with a 0.5 µm layer of polyimide 540. The 0.5 µm polyimide layer 540 being the sacrificial layer to release the MEMS structure as finally formed.

On top of the sacrificial polyimide layer 540 a further 2 µm spin-on polyimide layer is deposited in step 803 and patterned in step 804 by the deposition of an etch mask. The etch mask allowing the patterning of the 2 µm polyimide studs in step 805 that will ultimately be removed to form the lateral gaps between the MEMS elements. The etch mask may be a metal, such as chromium 560, photoresist or another material providing the desired selectivity of etch between the polyimide and itself.

Now referring to FIG. 8B at step 806 the initial 0.5 µm polyimide 540 is patterned and etched to provide the anchors for the MEMS elements, the anchors being those regions wherein the MEMS structure is attached to the silicon wafer 510. Next at step 807 a 60 nm aluminum 530 layer is deposited across the entire wafer surface forming the bottom and lateral structural interconnect, and the adhesion layer for the anchors, and is capped with an 80 nm chromium 560 layer which will act as the etch stop for the silicon carbide 570 MEMS structural layer. Accordingly in step 808 a 2 µm SiC 570 layer is deposited. In step 809 this is patterned leaving regions around the studs exposed. This region is then etched in step 809 to expose the 60 nm chromium 530/80 nm aluminum 530 atop the 2 µm polyimide 540 studs.

Referring now to FIG. 8C there is shown the next step 810 wherein these thin films atop the 2 µm polyimide 540 studs are etched back sufficiently to expose the top of the studs. Accordingly at this point the elements of the MEMS structure are isolated one from another as there is now no continuous SiC 570 film bridging over the polyimide 540 studs. In step 811 the SiC 570 is patterned with metallization for electrical interconnects, heaters, and other electrical structures according to the requirements of the MEMS devices being fabricated. Finally at step 812 the polyimide 540 is etched thereby releasing the MEMS structures, whereby the lateral gaps are formed where the polyimide 540 studs were provided in the first steps at step 805. The MEMS structures being anchored at the anchor regions defined within step 806.

Optionally the metallization deposited in step 801 allowing the formation of electrical interconnects beneath the MEMS structure may be omitted. Alternatively the metallization used may be other than aluminum (metal 0) according to the design requirements of the MEMS device and performance requirements, other metallizations including for example chromium, gold (Au), titanium (Ti), platinum (Pt), and TiPtAu. Whilst the process flow presented in respect of FIGS. 8A through 8C provides for lateral gaps within the manufacture of low temperature SiC structural layers for MEMS the formation of the polyimide 540 studs requires that the etching of the polyimide be timed to remove the second polyimide 540 layer everywhere except the studs. Hence, variations in polyimide 540 quality can easily result in the timed etch removing a portion of the initial 0.5 um polyimide 540 release layer. Accordingly there is shown in FIGS. 9A through 9C an alternative process flow wherein an etch stop is provided between the two polyimide 540 layers.

Figure 9A:
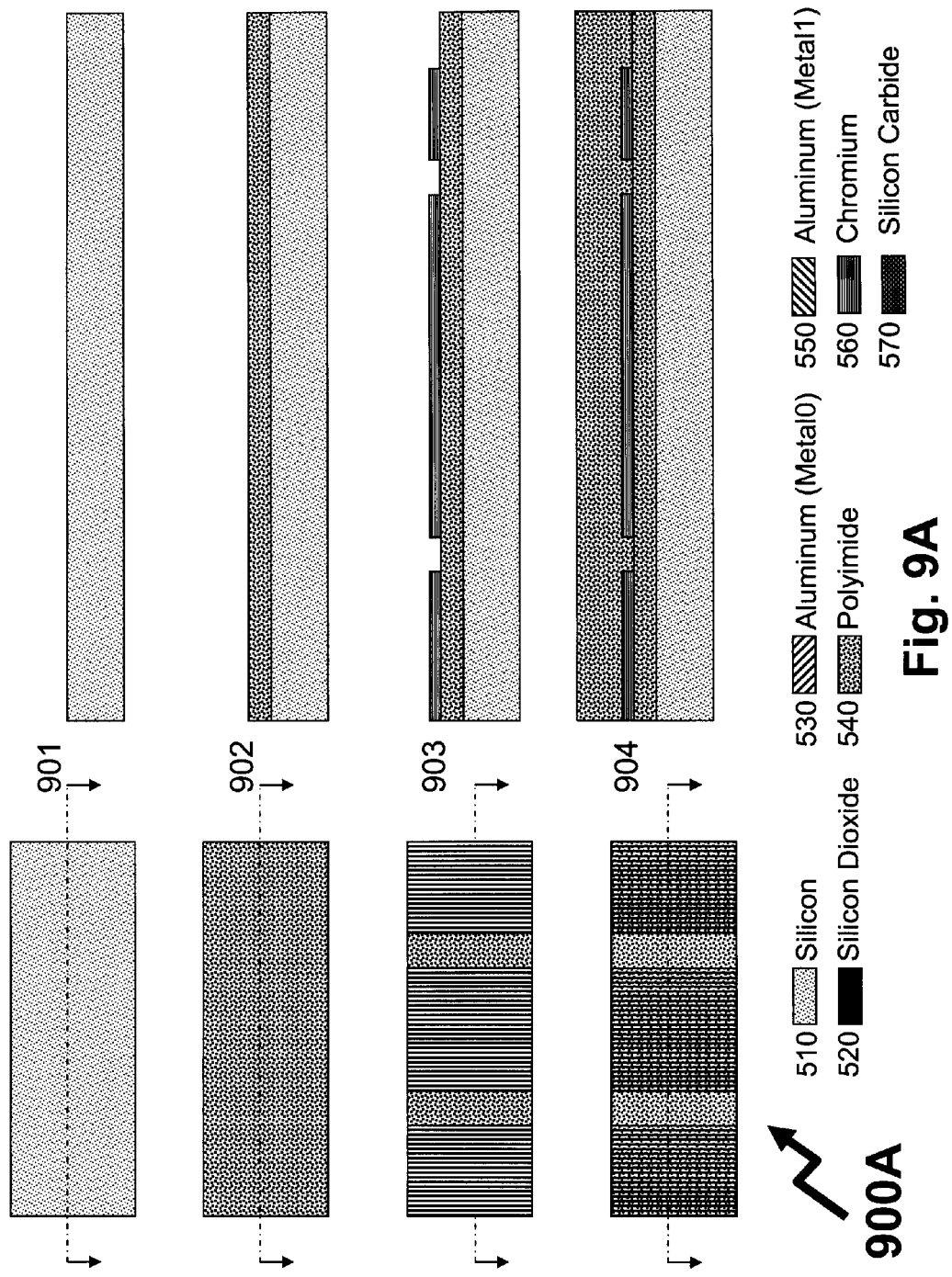
FIGS. 9A though 9C illustrate another embodiment of the invention to providing lateral features within a SiC ceramic MEMS.
Figure 9C:
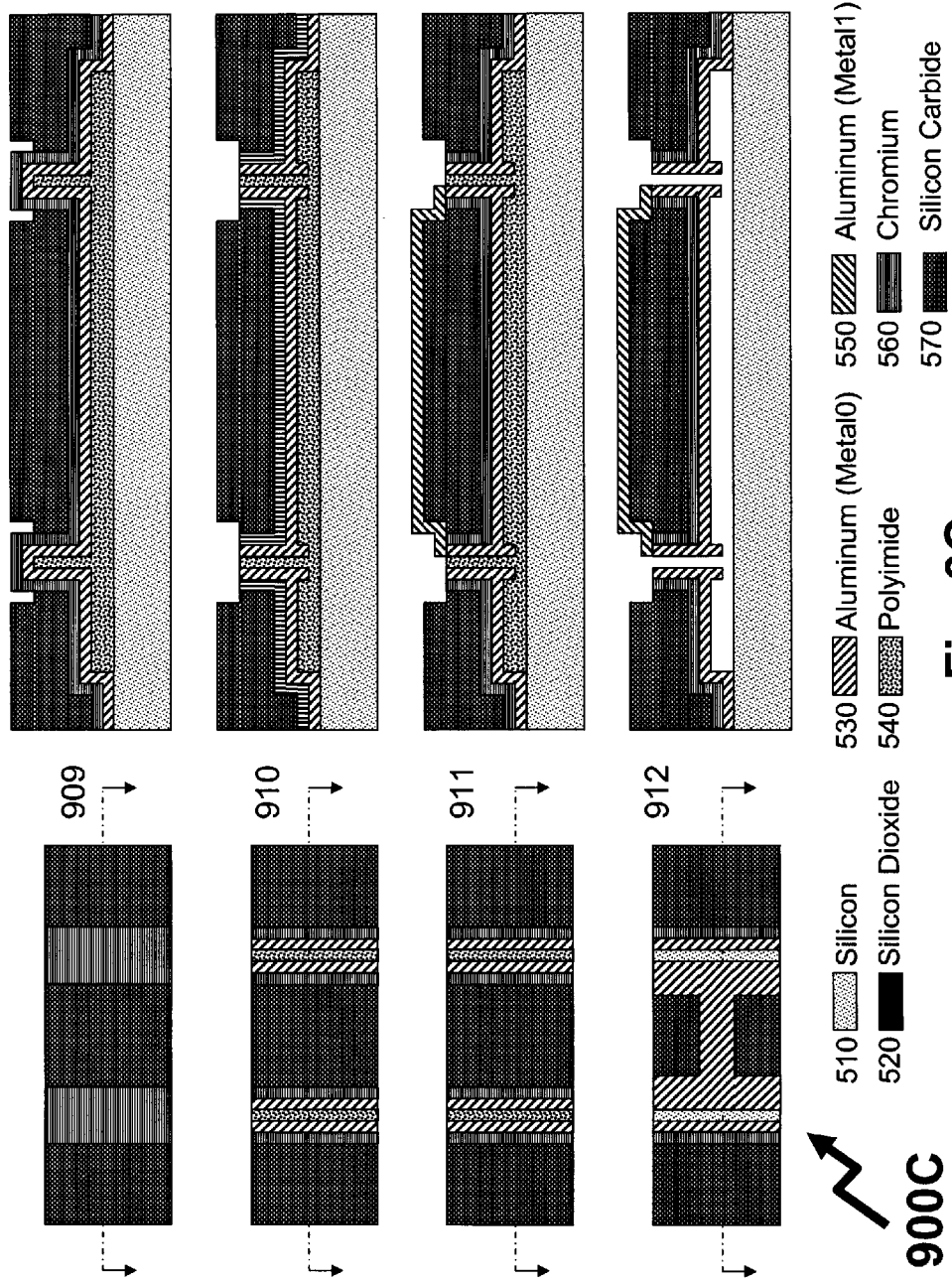

Referring to FIG. 9A the process flow is shown in plan and cross-sectional views 900A. In first step 901 a silicon wafer 510 is provided, the silicon wafer 510 may contain CMOS electronics or it may not. Next in step 902 the silicon wafer 810 is coated with a 0.5 µm layer of polyimide 540. The polyimide 540 being deposited directly where the silicon wafer 510 is a processed CMOS substrate, and hence there is present a passivation or planarization layer such as phosphosilicate glass, silicon oxide, or nitride. Optionally a 2.5 µm layer of silicon dioxide 520 to reduce electrical feed-through from the electrical interconnects of the MEMS structure to the Si CMOS within the silicon wafer 510. The 0.5 µm polyimide layer 540 being the sacrificial layer to release the MEMS structure as finally formed.

On top of the sacrificial polyimide layer 540 an 80 nm chromium 560 layer is deposited and patterned to define the stud windows. This acts to prevent the formation of conductive materials during subsequent processing that could pose a problem after the release step 912. Next a further 2 µm spin-on polyimide layer is deposited in step 903 and patterned in step 904 by the deposition of an etch mask, such as chromium 560. The etch mask allowing the patterning of the 2 µm polyimide studs in step 905 that will ultimately be removed to form the lateral gaps between the MEMS elements.

Now referring to FIG. 9B the 80 nm chromium 560 layer is patterned and the initial 0.5 µm polyimide 540 etched to provide the anchors for the MEMS elements, the anchors being those regions wherein the MEMS structure is attached to the silicon wafer 510. Next at step 907 a 60 nm aluminum 530 layer is deposited across the entire wafer surface forming the bottom and lateral structural interconnect, and the adhesion layer for the anchors, and is capped with an 80 nm chromium 560 layer which will act as the etch stop for the silicon carbide 570 MEMS structural layer. Accordingly in step 908 a 2 µm SiC 570 layer is deposited.

Referring now to FIG. 9C the next step 909 is shown wherein this is patterned leaving regions around the studs exposed. This region is then etched to expose the 60 nm chromium 530/80 nm aluminum 530 atop the 2 µm polyimide

540 studs. Next it is shown in step 910 that these thin films atop the 2 μm polyimide 540 studs are etched back sufficiently to expose the top of the studs. Accordingly at this point the elements of the MEMS structure are isolated one from another as there is now no continuous SiC 570 film bridging over the polyimide 540 studs. In step 911 the SiC 570 is patterned with metallization for electrical interconnects, heaters, and other electrical structures according to the requirements of the MEMS devices being fabricated.

Finally at step 912 the polyimide 540 is etched thereby releasing the MEMS structures, whereby the lateral gaps are formed where the polyimide 540 studs were provided in the first steps at step 905. The MEMS structures being anchored at the anchor regions defined within step 906. Optionally, at step 901 wherein a as processed silicon wafer is provided as the first step in the process it would be apparent from the process flow presented supra in respect of FIG. 8A that an initial metallization layer For embodiments of the invention described supra the sacrificial layer is polyimide. Polyimides are special types of polymers that have both excellent chemical resistance and thermal stability. Usually deposited in a spin coating process, the initial solution is composed of a high-molecular weight, polyamic acid precursor dissolved in an N-methyl-2-pyrrolidone (NMP) solvent system. The spun film is then cured at elevated temperatures, which evaporates any remaining solvent and converts the polyamic acid into its insoluble and highly chemically resistant form. After imidization is complete, these films are mechanically tough and can withstand a number of common solvents and acids, including acetone, isopropyl alcohol, PAN, and CR-14. Thus, this material is suitable for the process described in this work, which contains both aluminum and chromium layers. When used as a sacrificial material, it has many advantages. First, since it is deposited in a spin coating process, the deposition temperature is only limited by the curing step, which can be as low as 200° C. This makes it suitable for a low-temperature, CMOS-compatible MEMS fabrication processes according to embodiments of the invention. Second, polyimide films are readily etched in oxygen plasma and thus, devices can be released in a completely dry process which eliminates the need for complex drying procedures. Lastly, the thickness of the layer can be easily adjusted from a few microns all the way down to 100 nm by diluting with an appropriate solvent and by changing the spin speed. This allows for great design flexibility as outlined supra in respect of the different types of RF MEMS devices requiring different gap sizes and can be removed using dry oxygen plasma etching.

Whilst the embodiments described supra in respect of the low temperature CMOS compatible MEMS process have been described with respect to one materials system, SiC, and metallization it would be apparent that the invention relates to the provision of low temperature MEMS structural layers for CMOS integration with multiple levels of electrical interconnect, structural layers and isolated electrical interconnects.

Whilst the embodiments are described with respect to DC magnetron sputtering of SiC, optionally the SiC may be deposited by any sputtering process providing low maximum substrate temperatures. Optionally, SiC may be replaced by any ceramic structural layer, for example silicon, silicon dioxide, and silicon nitride. Similarly whilst the electrical interconnections have been described in respect of aluminum other metallization may be implemented according to the requirements of conductivity, resistance, environment, chemical resilience etc. Such alternative metallization including, but not limited to, gold, titanium, tungsten, silver, copper, and alloys thereof.

The sacrificial material whilst described in respect of polyimide may alternatively be any material that is suited to low-temperature spin-on or sputtered deposition techniques with appropriate sacrificial layer processing and ability to form the necessary requirements of the MEMS in respect of the thinness of the gap. Alternatives include sputtered, chromium, silicon, silicon dioxide, indium tin oxide (ITO), spin-on glasses, PMNA, parylene, or any organic compounds that could be used in the process at low temperatures.

In the exemplary embodiments described supra the processing of the dual layer polyimide 540 (initial first layer of 0.5 μm and subsequent layer of 2.0 μm) is not explicitly described in respect of the definition of the polyimide 540 studs photolithographically. In many instances the studs would be defined by conventional photolithographic processes such that the widths of the studs, and hence finally defined lateral gaps, are determined by the minimum feature widths of the photolithographic process employed. However, alternatively the polyimide 540 studs may be defined by a two step process wherein the first step is a photolithographic process followed by an etching step. This allows the studs to be thinned below the minimum feature size of the photolithographic process. For example, etching 0.25 μm from the polyimide structure with a fpm photolithographic process results in a stud 0.5 μm wide. Such a stud requiring for example a substantial shift from contact lithography to provide the 1 μm features to projection lithography to provide 0.5 μm features, a significant shift in cost of photolithography processes and one where the projection lithography may have degraded yield due to topography.

Figure 10A:
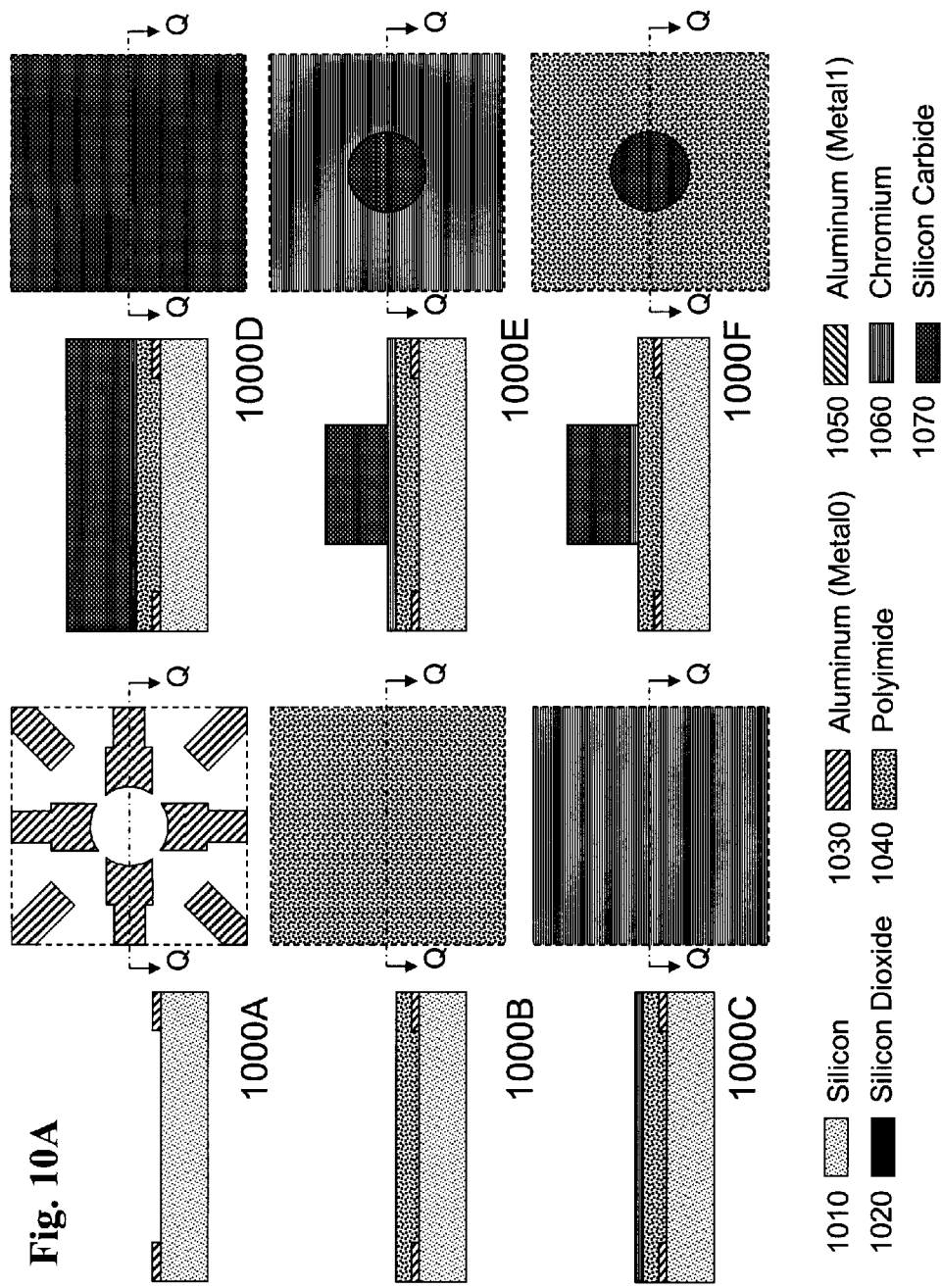
FIGS. 10A through 10C illustrate an exemplary process flow for providing a MEMS SiC on Si CMOS according to an embodiment of the invention using e-beam lithography.
Figure 10B:
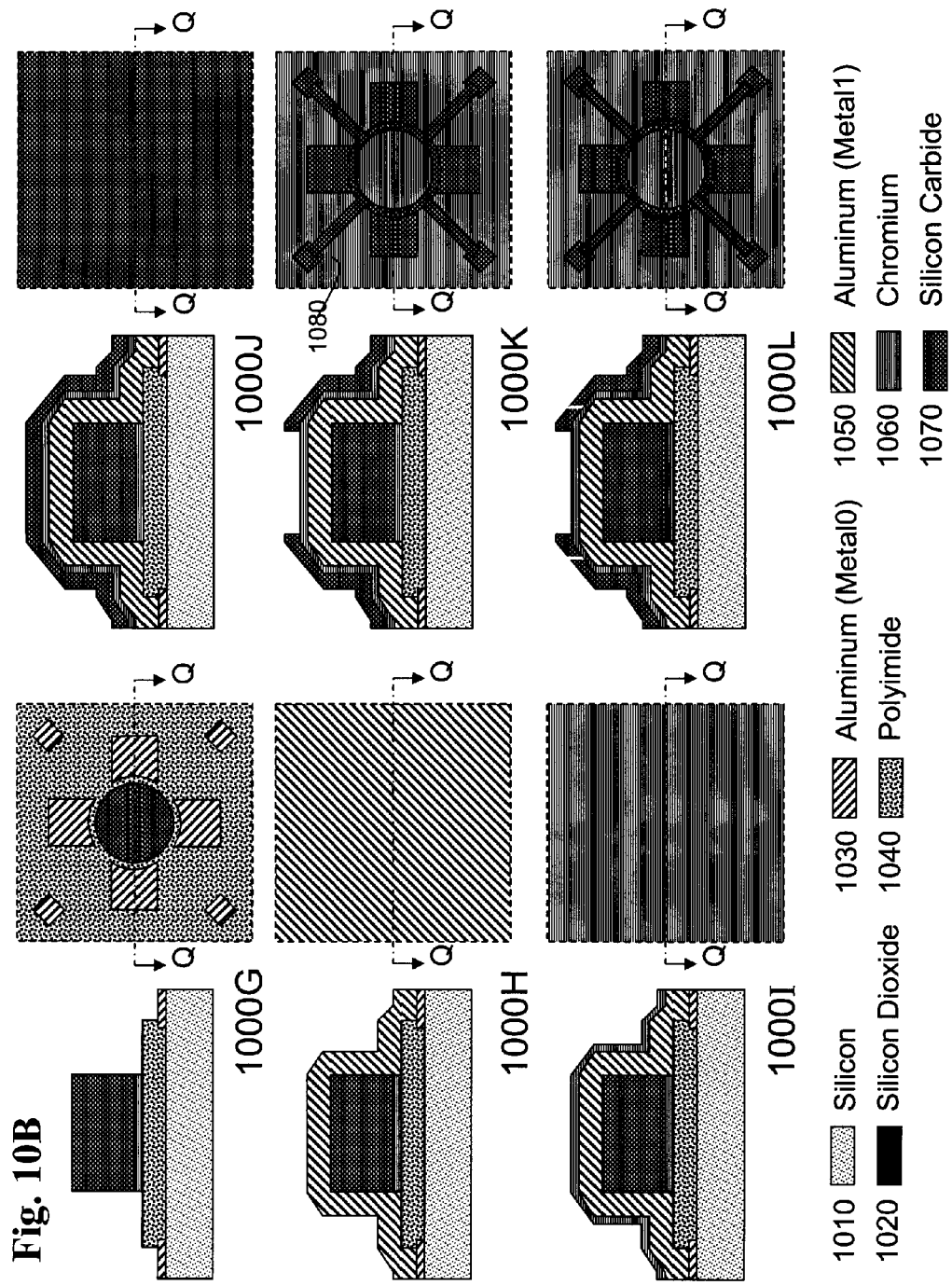
Figure 10C:
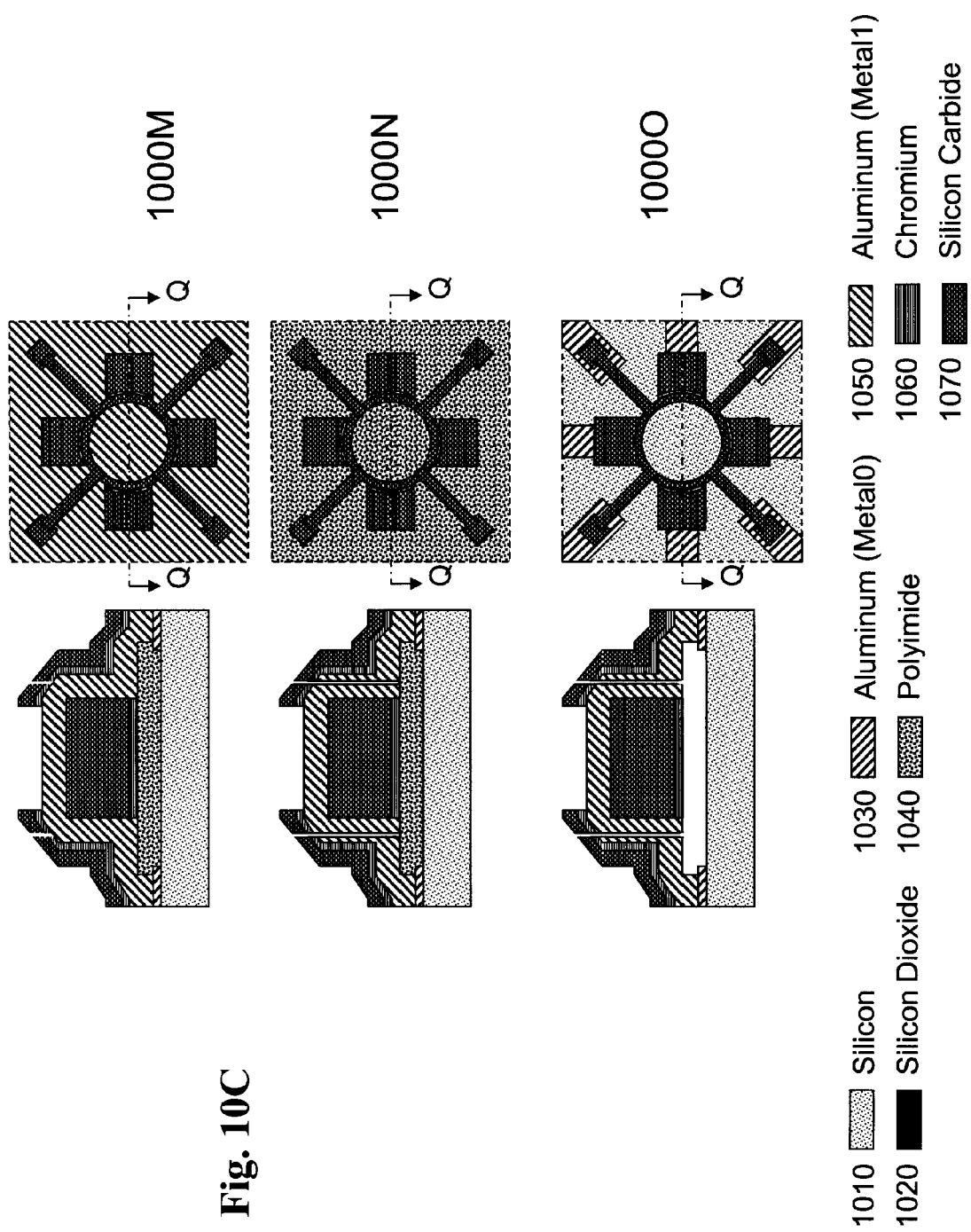

Accordingly as shown in FIGS. 10A through 10C there is illustrated an exemplary process flow for providing a MEMS SiC on Si CMOS according to an embodiment of the invention using e-beam lithography to form resonator structure such as presented supra in respect of FIG. 4C. Now referring to FIG. 10A the initial process steps are shown in plan and cross-sectional views 1000A. The cross-sectional views being along section line Q-Q. In first step 1000A a silicon wafer 1010 is provided, the silicon wafer 1010 may contain CMOS electronics or it may not. The silicon wafer 1010 having had an interconnection layer patterned using a first mask, the interconnection layer being approximately 60 nm aluminum (Metal 0) 1030. Next in step 1000B the patterned silicon wafer 1010 is coated with a nominal 1 μm layer of polyimide 1040, for example by a spin coating process, after which as shown in step 1000C it is coated with approximately 80 nm barrier layer formed from chromium 1060. The chromium 1060 for example being deposited by DC sputtering.

Next as shown in step 1000D a first structural layer is deposited, by DC sputtering for example, of nominal thickness 2 μm and of SiC 1070. This SiC 1070 is then etched in step 1000E using a NF$_3$ based reactive ion etching (RIE) step with a second photolithographic process using a second mask which patterns the SiC 1070 into a disc. Subsequently in step 1000F the exposed barrier layer, being chromium 1060, is removed with a wet etch process. Next, as shown in FIG. 10B, step 1000G is performed wherein the polyimide 1040 layer is processed using a photolithographic step with a third mask and oxygen based RIE etch to define and expose the anchors for the resonator structure in the interconnection layer, namely the aluminum (Metal 0) 1030.

In step 1000H a metallization process is performed, wherein a second metallization, in this case approximately 1 μm aluminum (Metal 1) 1050, is deposited across the wafer using a DC sputter process. This aluminum is then covered with a second barrier layer, similarly approximately 80 nm of chromium 1060, in step 10001 with another DC sputtering process. Then as shown with step 1000J a DC sputtering deposition of a second structural layer, being approximately 0.5 μm thick SiC 1070, is performed. Using another photolithographic process with a fourth mask and another NF$_3$ RIE the second SiC 1070 structural layer is patterned as shown in 1000K. Next as shown in step 1000L the lateral gaps of the resonator structure are formed in the second structural layer, SiC 1070, through an electron-beam (e-beam) lithography step and another RIE. These gaps being for example a nominal 50 nm to 100 nm wide.

Now, as shown in FIG. 10C and step 1000M, the second barrier layer of chromium 1060 is removed using a CR-14S based wet etch. Then with a further RIE step as shown in step 1000N the aluminum (Metal 1) 1050 beneath the exposed gap is etched thereby separating the resonator from the surrounding material with the exception of the small anchors 1080. Finally in step 1000O the resonator is released from the substrate, silicon 1010, by the removal of the polyimide 1040 by an oxygen plasma based ashing process. Accordingly the resonator is formed primarily from SiC 1070 with wrap-over metallization, being aluminum (Metal 1) 1050 and adjacent electrodes similarly formed from aluminum (Metal 1) 1050 which due to their high sidewalls have been similarly reinforced with structural material, SiC 1070.

It would be evident to one skilled in the art that whilst the deep RIE shown in steps 1000N and 1000O is shown as vertical that some process undercutting would occur according to the etch process employed. The resulting tapered gap profiles would still allow the resultant resonator structure to operate.

Figure 11A:
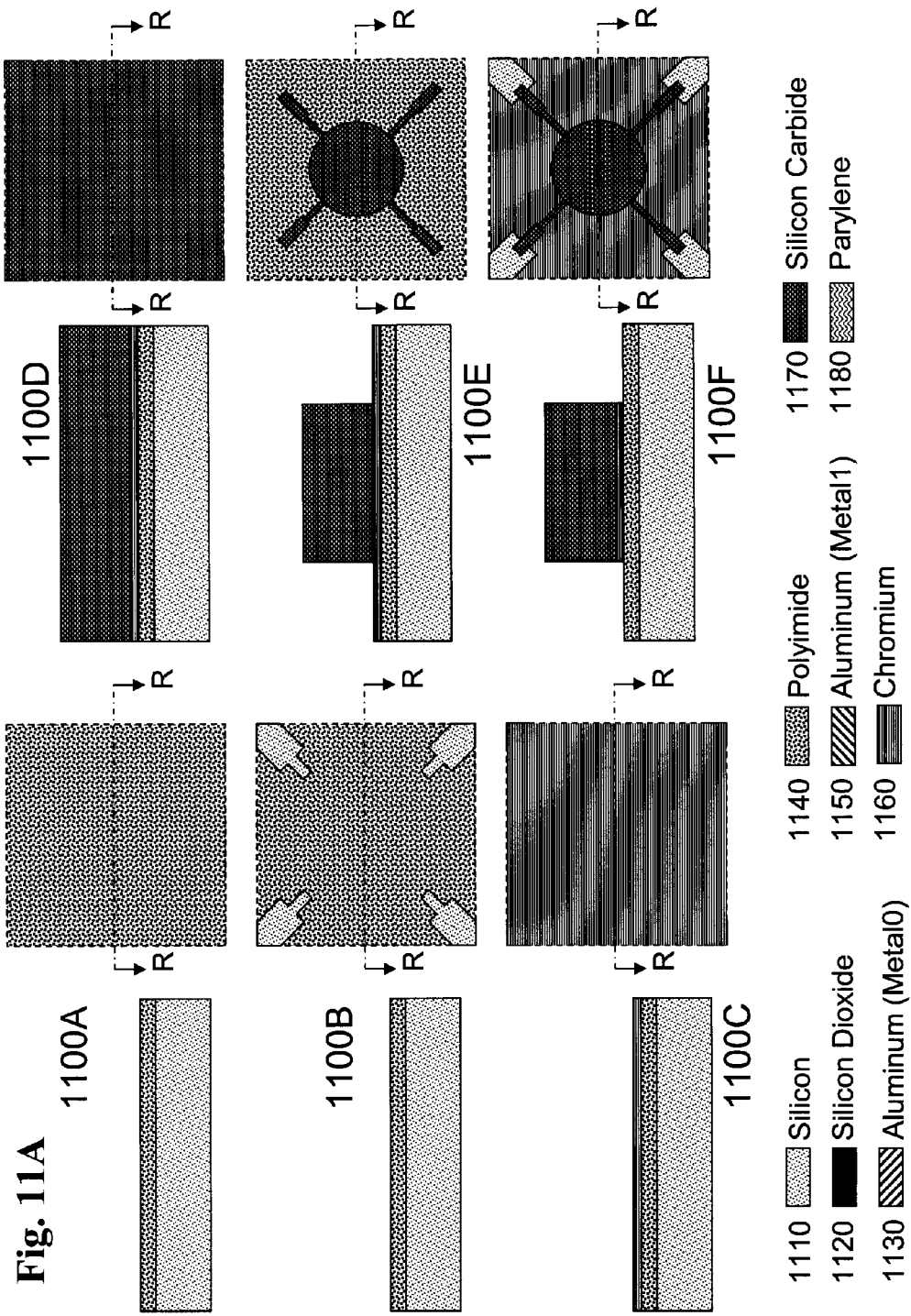
FIGS. 11A through 11C illustrate an exemplary process flow for a reinforced MEMS on Si CMOS according to an embodiment of the invention using two sacrificial materials and two structural materials.
Figure 11B:
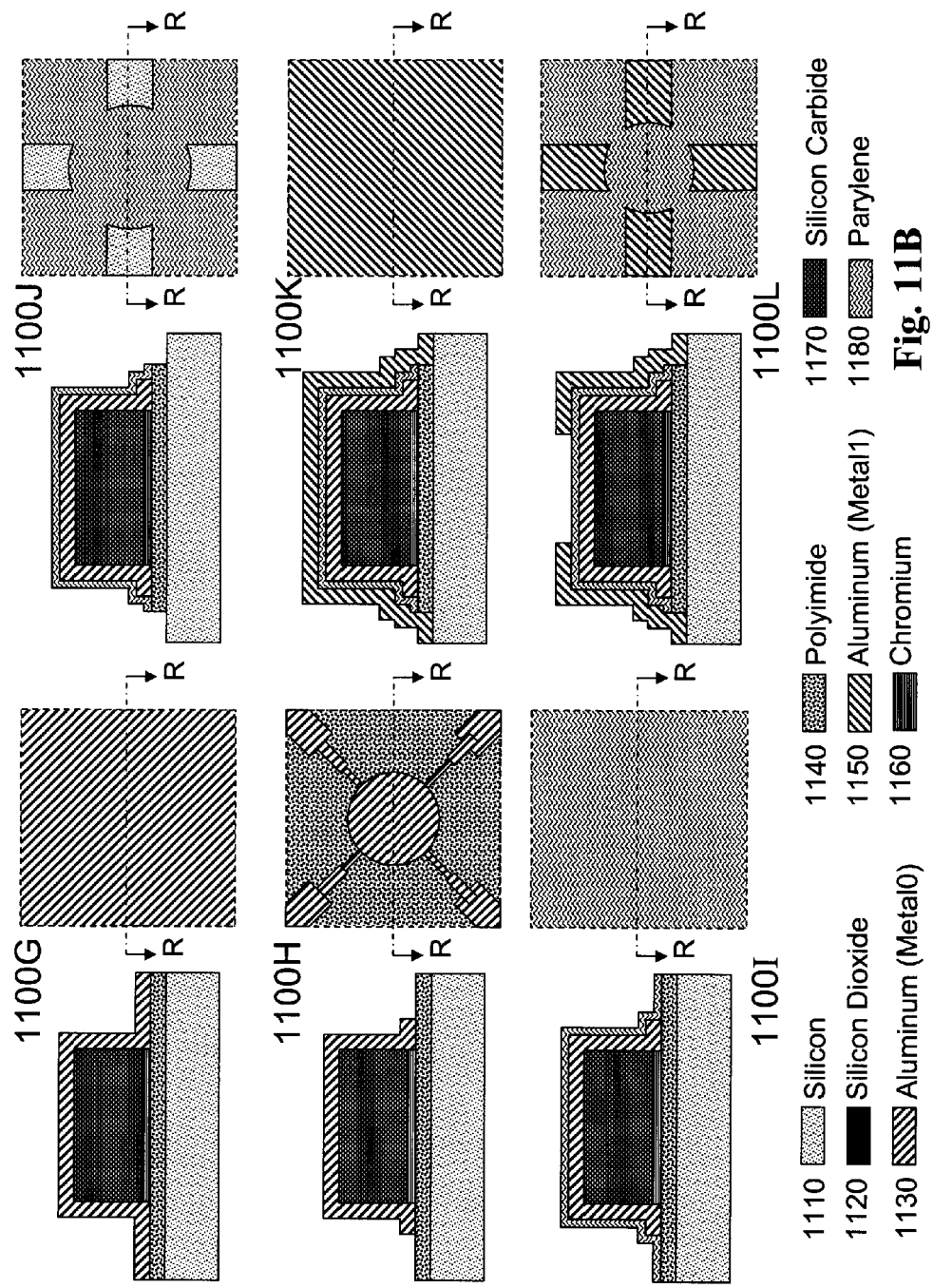
Figure 11C:
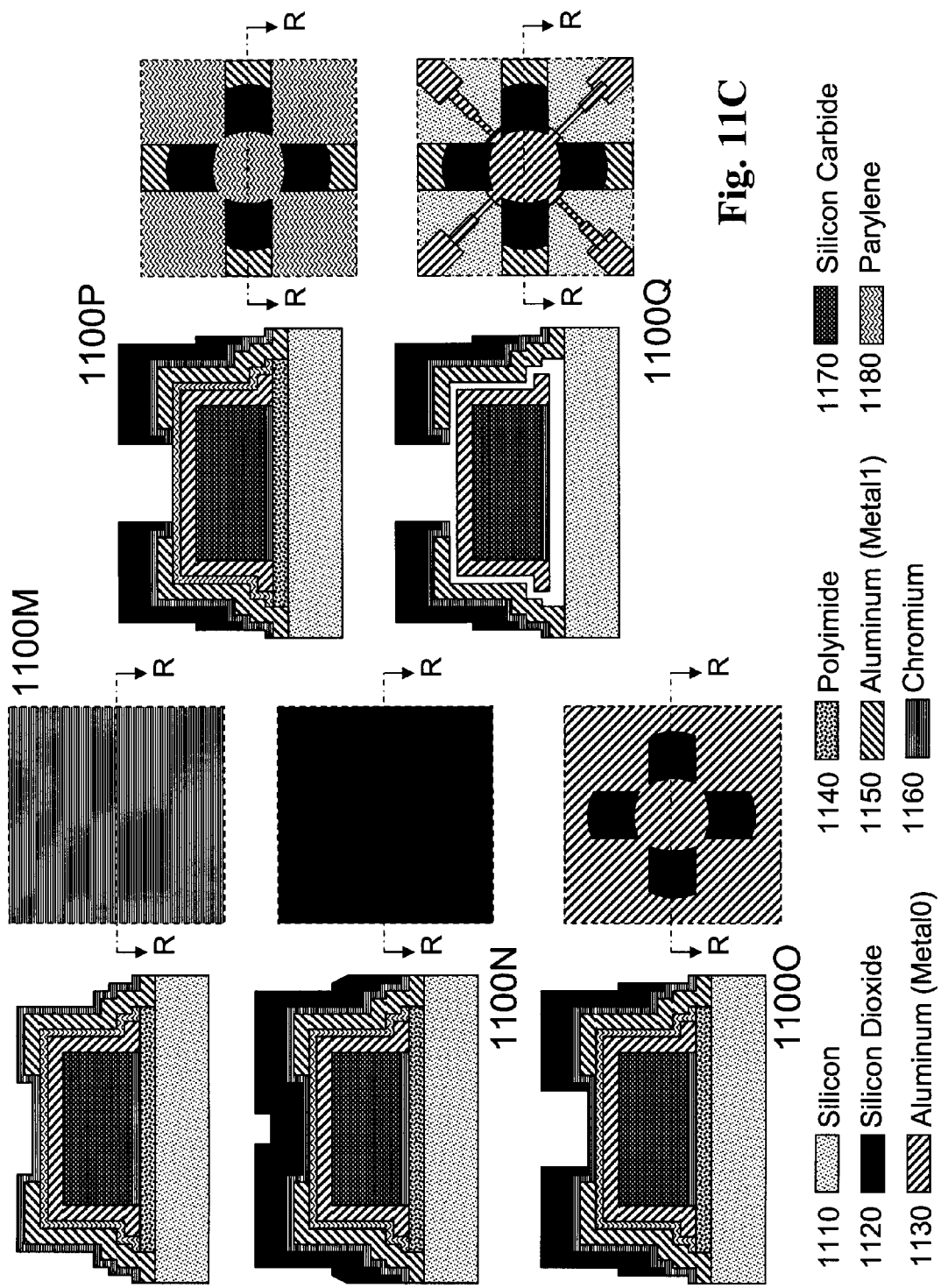

Now referring to FIGS. 11A through 11C there is illustrated an exemplary process flow for a reinforced MEMS resonator on Si CMOS according to an embodiment of the invention using two sacrificial materials and two structural materials. This process being shown plan and cross-sectional views, the first step in 1100 Å of FIG. 11A, wherein the cross-sectional view is along section line R-R. In first step 1100A a silicon wafer 1110 which may contain CMOS electronics or it may not, is coated with a nominal 0.5 μm layer of polyimide 1140, for example by a spin coating process, after which as shown in step 1100B it is patterned using a first photolithography step and an oxygen based RIE to form exposed disk anchor sites on the silicon 1110. Next in step 1100C the wafer is coated with approximately 80 nm barrier layer formed from chromium 1060. The chromium 1060 for example being deposited by DC sputtering.

Next as shown in step 1100D a first structural layer is deposited, by DC sputtering for example, of nominal thickness 2 μm and of SiC 1070. This SiC 1070 is then patterned in step 1100E using a NF$_3$ based reactive ion etching (RIE) step with a second photolithographic process using a second mask to form the resonator disc and anchor arms. Subsequently in step 1100F the exposed barrier layer, being chromium 1160, is removed with a wet etch process. Next, as shown in FIG. 11B, step 1100G is performed wherein a first metallization is deposited, in this example by DC sputtering approximately 60 nm aluminum (Metal 0) 1030. This first metallization is then patterned in step 1100H using a photolithography process with a third mask and a phosphoric—acetic—nitric (PAN) etch.

Next in step 1100I the wafer is coated with approximately 100 nm layer of parylene 1080. The parylene 1080 forming the second sacrificial material within the process, the first being the polyimide 1040 deposited in the first step 1100A. Parylene being the tradename for a variety of chemical vapor deposited poly(p-xylylene) polymers. Next in FIG. 11B step 1100J is shown wherein the parylene 1080 is processed using another photolithography step exploiting a fourth mask and an oxygen based RIE to expose the electrode anchors. At this point the second metallization is deposited, as shown in step 1100K, this being approximately 60 nm aluminum (Metal 1) 1050, and then patterned in step 1100L using another PAN etch process. The aluminum (Metal 1) 1050 having been patterned with another photolithography process exploiting a fifth mask.

Subsequently in step 1100M of FIG. 11C the wafer is coated with a further barrier of chromium 1160, approximately 80 nm thick, before a layer of second structural material, in this case 0.5 μm of silicon dioxide 1120, is deposited by low temperature PECVD in step 1100N. The second structural material is then patterned in step 1100O after a further photolithography step with a sixth mask and an NF$_3$ RIE, thereby forming the reinforcement for the electrode structures with the silicon dioxide 1120. Next in step 1100P the chromium 1160 barrier layer is removed using another CR-14S etching process thereby providing electrical isolation of the electrodes and completing all processing steps relating to the mechanical and electrical structure of the resonator.

All that remains in step 1100P is the removal of the first and second barrier layers, being polyimide 1140 and parylene 1180 respectively. This for example being achieved with an oxygen plasma based ashing process. In this final step therefore the resonator structure is released from the silicon 1110 and the electrode structures. It would be apparent to one of skill in the art that the process presented supra in respect of FIGS. 11A through 11C may alternatively employ a single structural ceramic material, for example SiC 1070, and/or a single sacrificial material, for example polyimide 1040.

Referring to FIG. 12A there is shown an alternative embodiment of the invention as applied to a resonator 1200. As described supra in respect of FIG. 4 and the BAW resonator 4000 a DC-bias ($V_{bias}$) is applied to the resonator, an AC voltage is applied to one pair of diametrically opposed electrode structures, and a second pair of diametrically opposed electrode structures 90 degrees rotated from those providing the applied AC drive voltage extract the resonant electrical signal. The DC bias being applied through to the resonator disc through the metallization atop the supporting arms.

An advantage of paralyne within the exemplary embodiment presented supra in respect of FIGS. 11A through 11C is that it can provide an improved step coverage for a thin (~100 nm film) when compared with a spun on layer such as polyimide.

However, as shown in FIG. 12A the resonator 1200 still comprises two pairs of diametrically opposed electrode structures, represented by first electrodes 1240 and second electrodes 1250 respectively. However, the electrical structure on the resonator disc itself now comprises a single continuous metallization 1230 running from one resonator arm to a diametrically opposed resonator arm, with the other pair of diametrically opposed resonator arms electrically isolated from each other and the single continuous metallization 1230, these being first arm metallization 1210 and second arm metallization. Accordingly therefore a DC bias may be applied through the first and second arm metallizations 1210 and 1220 respectively whilst an electrical current can be flowed through the single continuous metallization 1230 which thereby acts as a heater structure for the resonator element overall.

Now referring to FIG. 12B there is shown first cross-section S-S through the resonator 1200. Hence there is shown the continuous metallization 1230 deposited across the upper surface of the resonator disc, along the resonator arms 1260 and then onto the upper surface of the silicon substrate. Next in FIG. 12C there is shown the second cross-section T-T through the resonator 1200. Now, there is shown first arm metallization 1210 atop a first resonator arm 1262 and onto the resonator disc, second arm metallization 1220 atop a second resonator arm 1264 and onto the resonator disc. Then shown isolated from the first and second metallizations 1210 and 1230 is the continuous metallization 1230 forming the heater element atop the resonator disc.

It would apparent to one skilled in the art that the heater element atop the resonator disc may be used for resonant frequency tuning of the resonator or to enhance resonator stability with a temperature feedback control system.

It will be evident to one skilled in the art that the embodiments presented supra will be applicable to a wide range of MEMS devices including but not limited to resonators, accelerometers, comb drives, hinges, etc wherein MEMS elements are separated by lateral gaps.

Numerous other embodiments may be envisaged without departing from the spirit or scope of the invention.

What is claimed is:

1. A method comprising:
providing a substrate; and
providing at least a low temperature deposited MEMS structure comprising at least two MEMS elements, the two MEMS elements manufactured with manufacturing sequence having the substrate exposed to a maximum temperature of at least one of 250° C. and 350° C. and being laterally disposed on the substrate with a gap between them along first predetermined adjacent portions of the two MEMS elements and metallization upon second predetermined portions of the first predetermined adjacent portions of the two MEMS elements, wherein the lateral gap is less than the thickness of the first predetermined adjacent portions of the two MEMS elements.

2. A method according to claim 1, wherein
the providing a substrate comprises providing a substrate containing at least an electronic circuit.

3. A method according to claim 2, wherein
the providing at least a low temperature deposited MEMS structure comprises providing the low temperature deposited MEMS structure electrically interconnected to the at least an electronic circuit.

4. A method according to claim 1, wherein
the providing at least a low temperature deposited MEMS structure comprises providing a MEMS structure having at least one of the two MEMS elements capable of displacement vertically relative to the other of the two MEMS elements.

5. A method according to claim 1, wherein
the providing at least a low temperature deposited MEMS structure comprises providing at least one structural layer selected from the group consisting of silicon, silicon dioxide, silicon nitride, silicon oxynitride, carbon, aluminum oxide, silicon carbide, and a ceramic.

6. A method according to claim 1, wherein
the second predetermined portions are the same material as the first predetermined adjacent portions of the two MEMS elements; and
the first predetermined adjacent portions are the majority of the sidewalls of the two MEMS elements forming the lateral gap.

7. A method according to claim 1, wherein
providing the metallization comprises providing at least one layer of metallization of a plurality of metallization to a structural layer, the structural layer comprising a predetermined portion of the MEMS structure.

8. A method according to claim 7, wherein
providing at least one layer of metallization of a plurality of metallizations comprises providing the at least one layer of metallization to at least one of an upper surface of the substrate, a surface of the structural layer between the structural layer and the substrate, a surface of the structural layer, and those surfaces of the structural layer substantially facing the lateral gap.

9. A method according to claim 1, wherein
the providing at least a low temperature deposited MEMS structure comprises providing at least one of an etch-stop layer and a sacrificial layer for at least a predetermined portion of the manufacturing process of the low temperature deposited MEMS structure.

10. A method according to claim 9, wherein the sacrificial layer comprises at least one of:
a first predetermined portion beneath the low temperature deposited MEMS structure, the first predetermined portion having no attachment to a substrate supporting the MEMS structure upon removal of the sacrificial layer; and
a second predetermined portion between the two MEMS elements, the second predetermined portion providing the lateral gap upon removal of the sacrificial layer.

11. A method according to claim 10, wherein
the sacrificial layer is removed from those regions of the substrate where physical attachment of the low temperature deposited MEMS structure to the substrate is required.

12. A method according to claim 1, wherein
the providing at least a low temperature deposited MEMS structure comprises manufacturing the low temperature deposited MEMS structure using a process incorporating at least a two-layer etch mask for at least a structural layer of the low temperature deposited MEMS structure.

13. A device comprising:
a substrate; and
at least a low temperature deposited MEMS structure comprising at least two MEMS elements, the two MEMS elements manufactured with manufacturing sequence having the substrate exposed to a maximum temperature of at least one of 250° C. and 350° C. and being laterally disposed on the substrate with a gap between them along first predetermined adjacent portions of the two MEMS elements and metallization upon second predetermined portions of the first predetermined adjacent portions of the two MEMS elements, wherein the lateral gap is less than the thickness of the first predetermined adjacent portions of the two MEMS elements.

14. The device according to claim 13, wherein
a predetermined portion of the substrate comprises an electronic circuit.

15. The device according to claim 14, wherein
the low temperature deposited MEMS structure is electrically interconnected to the electronic circuit.

16. The device according to claim 13, wherein
the low temperature deposited MEMS structure has at least one of the two MEMS elements capable of displacement vertically relative to the other of the two MEMS elements.

17. The device according to claim 13, wherein
the MEMS structure comprises at least one structural layer selected from the group consisting of silicon, silicon dioxide, silicon nitride, silicon oxynitride, carbon, aluminum oxide, silicon carbide, and a ceramic.

18. The device according to claim 13, wherein the metallization comprises at least one layer of metallization of a plurality of metallizations to a structural layer, the structural layer comprising a predetermined portion of the MEMS structure.

19. The device according to claim 18, wherein the at least one layer of metallization of a plurality of metallizations is provided to at least one of an upper surface of the substrate, a surface of the structural layer between the structural layer and the substrate, a surface of the structural layer, and those surfaces of the structural layer substantially facing the lateral gap.

20. The device according to claim 13, wherein the low temperature deposited MEMS structure is fabricated by providing at least one of an etch-stop layer and a sacrificial layer for at least a predetermined portion of the manufacturing process of the low temperature deposited MEMS structure.

21. The device according to claim 20, wherein the sacrificial layer comprises at least one of:
a first predetermined portion beneath the low temperature deposited MEMS structure, the first predetermined portion having no attachment to a substrate supporting the MEMS structure upon removal of the sacrificial layer; and
a second predetermined portion between the two MEMS elements, the second predetermined portion providing the lateral gap upon removal of the sacrificial layer.

22. The device according to claim 21, wherein the sacrificial layer is removed from those regions of the substrate where physical attachment of the low temperature deposited MEMS structure to the substrate is required.

23. The device according to claim 13, wherein the low temperature deposited MEMS structure is fabricated using a process incorporating at least a two-layer etch mask for at least a structural layer of the low temperature deposited MEMS structure.

24. The device according to claim 13, wherein the second predetermined portions are the same material as the first predetermined adjacent portions of the two MEMS elements; and
the first predetermined adjacent portions are the majority of the sidewalls of the two MEMS elements forming the lateral gap.

* * * * *